US008855159B2

(12) United States Patent
Sato et al.

(10) Patent No.: US 8,855,159 B2
(45) Date of Patent: Oct. 7, 2014

(54) SURFACE-EMITTING LASER ELEMENT, SURFACE-EMITTING LASER ARRAY, OPTICAL SCANNER DEVICE, AND IMAGE FORMING APPARATUS

(75) Inventors: Shunichi Sato, Miyagi (JP); Kazuhiro Harasaka, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 393 days.

(21) Appl. No.: 12/950,365

(22) Filed: Nov. 19, 2010

(65) Prior Publication Data
US 2011/0128343 A1 Jun. 2, 2011

(30) Foreign Application Priority Data

Nov. 27, 2009 (JP) ................................. 2009-269358
Jul. 1, 2010 (JP) ................................. 2010-150759

(51) Int. Cl.
*H01S 5/00* (2006.01)
(52) U.S. Cl.
USPC ................................. 372/46.01; 372/50.124
(58) Field of Classification Search
USPC .......................................... 372/46.01, 50.124
See application file for complete search history.

(56) References Cited

U.S. PATENT DOCUMENTS

| 5,923,691 | A | 7/1999 | Sato |
| 5,939,733 | A | 8/1999 | Sato |
| 5,940,422 | A | 8/1999 | Sato |
| 6,002,700 | A | 12/1999 | Sato |
| 6,072,196 | A | 6/2000 | Sato |
| 6,207,973 | B1 | 3/2001 | Sato et al. |
| 6,233,264 | B1 | 5/2001 | Sato |
| 6,529,541 | B1 | 3/2003 | Ueki et al. |
| 6,542,528 | B1 | 4/2003 | Sato et al. |
| 6,563,851 | B1 | 5/2003 | Jikutani et al. |
| 6,614,821 | B1 | 9/2003 | Jikutani et al. |
| 6,674,785 | B2 | 1/2004 | Sato et al. |
| 6,765,232 | B2 | 7/2004 | Takahashi et al. |
| 6,803,604 | B2 | 10/2004 | Takahashi et al. |
| 6,927,412 | B2 | 8/2005 | Takahashi et al. |

(Continued)

FOREIGN PATENT DOCUMENTS

| EP | 1130720 A1 | 9/2001 |
| EP | 2323231 A1 | 5/2011 |

(Continued)

OTHER PUBLICATIONS

Feb. 6, 2012 European official action in connection with counterpart European patent application No. 10 192 604.6.

(Continued)

*Primary Examiner* — Yuanda Zhang
(74) *Attorney, Agent, or Firm* — Cooper & Dunham LLP

(57) ABSTRACT

A disclosed surface-emitting laser element includes a resonator structure having an active layer, a first semiconductor multilayer mirror and a second semiconductor multilayer mirror configured to sandwich the resonator structure having the active layer, an electrode provided around an emission region of a light-emitting surface, and a dielectric film provided in a peripheral portion within the emission region and outside a central portion of the emission region to make a reflectance of the peripheral portion lower than a reflectance of the central portion. In the surface-emitting laser element, an outer shape of a portion where the electrode provided around the emission region of the light-emitting surface is in contact with a contact layer includes corners.

21 Claims, 38 Drawing Sheets

(56) References Cited

U.S. PATENT DOCUMENTS

| | | |
|---|---|---|
| 6,959,025 B2 | 10/2005 | Jikutani et al. |
| 6,975,663 B2 | 12/2005 | Sekiya et al. |
| 7,466,738 B2 | 12/2008 | Jikutani |
| 7,542,499 B2 | 6/2009 | Jikutani |
| 7,684,458 B2 | 3/2010 | Sato et al. |
| 7,693,204 B2 | 4/2010 | Sato et al. |
| 7,720,125 B2 | 5/2010 | Jikutani et al. |
| 7,746,912 B2 | 6/2010 | Motomura et al. |
| 7,800,805 B2 | 9/2010 | Hayashi et al. |
| 2005/0084218 A1 | 4/2005 | Ide et al. |
| 2007/0014324 A1* | 1/2007 | Maeda et al. ............... 372/46.01 |
| 2007/0223546 A1* | 9/2007 | Brenner et al. ............. 372/43.01 |
| 2008/0024849 A1* | 1/2008 | Hayashi et al. ............... 359/204 |
| 2008/0055672 A1 | 3/2008 | Watanabe et al. |
| 2008/0233017 A1 | 9/2008 | Sato et al. |
| 2009/0262770 A1 | 10/2009 | Itoh et al. |
| 2009/0285252 A1 | 11/2009 | Ishii et al. |
| 2009/0285602 A1 | 11/2009 | Harasaka et al. |
| 2009/0295902 A1 | 12/2009 | Sato et al. |
| 2009/0303308 A1 | 12/2009 | Itoh et al. |
| 2009/0310632 A1* | 12/2009 | Sugawara et al. ............... 372/24 |
| 2010/0060712 A1 | 3/2010 | Sato et al. |
| 2011/0115872 A1 | 5/2011 | Harasaka et al. |

FOREIGN PATENT DOCUMENTS

| | | |
|---|---|---|
| JP | 10-242560 | 9/1998 |
| JP | 11-46036 | 2/1999 |
| JP | 2001-156395 | 6/2001 |
| JP | 2002-9393 | 1/2002 |
| JP | 2002-208755 | 7/2002 |
| JP | 2006-210429 | 8/2006 |
| JP | 2008-16824 | 1/2008 |
| WO | WO01/20734 | 3/2001 |

OTHER PUBLICATIONS

Mar. 1, 2011 European search report in connection with counterpart European patent application No. 10 19 2604.

Japanese official action dated Dec. 17, 2013 in corresponding Japanese patent application No. 2010-150759.

\* cited by examiner

ELEMENT (MESA)

SURFACE-EMITTING LASER ELEMENT, SURFACE-EMITTING LASER ARRAY, OPTICAL SCANNER DEVICE, AND IMAGE FORMING APPARATUS

BACKGROUND OF THE INVENTION

1. Field of the Invention

The invention generally relates to surface-emitting laser elements, surface-emitting laser arrays, optical scanner devices and image forming apparatuses, and more particularly to a surface-emitting laser element capable of emitting a laser beam in a direction perpendicular to a substrate, a surface-emitting laser array including therein a plurality of such surface-emitting laser elements, an optical scanner device having such a surface-emitting laser array, and an image forming apparatus having such an optical scanner device.

2. Description of the Related Art

Vertical cavity surface-emitting semiconductor lasers (i.e., VCSELs) are configured to emit a laser beam perpendicular to a substrate. The VCSELs have attracted much attention because of their low fabrication cost, their low power consumption, their compactability, their suitability for forming two-dimensional devices, and their high performance in comparison with edge-emitting semiconductor lasers that emit a laser beam in parallel with a substrate.

The VCSELs may be applied in the field of a light source for optical recording in a printer (oscillation wavelength: 780 nm), a light source for recording of an optical disk (oscillation wavelengths: 780 nm, 850 nm), and a light source for an optical transmission system such as Local Area Network or LAN utilizing optical fibers (oscillation wavelengths: 780 nm, 850 nm, 1.3 µm, and 1.5 µm). Further, the VCSELs may be applied as a light source for optical transmission between boards, within a board, between chips in a Large-scale integrated circuit or LSI, or within the chip of the integrated circuit.

In the above applied field of the VCSELs, light emitted from the VCSEL (hereinafter also simply called "emission light") may preferably have high single transverse mode output power. Specifically, the VCSELs are frequently optimized for emitting light in high power basic transverse mode oscillation. Accordingly, the higher order transverse mode of the VCSELs may need to be controlled, and various attempts have been carried out to achieve this.

Japanese Patent Application Publication No. 2002-208755 (hereinafter referred to as "Patent Document 1"), for example, discloses a surface emitting semiconductor laser that includes a semiconductor substrate, a lower multilayer mirror, an active layer region and an upper multilayer mirror formed in this order on the substrate, an upper electrode having an opening bored for forming a laser beam emitting region, the upper electrode being formed on an upper layer of the upper multilayer mirror, and a current restriction part formed by insulating a periphery of a current channel and arranged between the upper electrode and the lower multilayer mirror. The aperture size of the opening of the upper electrode and the aperture size of the current restriction part are determined so as to increase the difference between the optical loss of a resonator in a higher-order transverse mode laser beam and the optical loss of the resonator in a basic transverse mode laser beam, based on the reflectivity of the resonator on a region corresponding to the upper electrode. The disclosed surface-emitting semiconductor laser causes a loss in a higher-order transverse mode laser beam exhibiting a high optical intensity in a region distant from a center of an emission region to selectively oscillate a basic transverse mode laser beam that exhibits the high optical intensity in the center of the emission region and low optical intensity in the region distant from the center of the emission region.

Specifically, the opening diameter of the electrode is 0.5 µm larger than the aperture size of the current restriction part.

Similarly, a surface emitting semiconductor laser disclosed, for example, in Japanese Patent Application Publication No. 2001-156395 (hereinafter referred to as "Patent Document 2"), U.S. Pat. No. 5,940,422 (hereinafter referred to as "Patent Document 3"), and Japanese Patent Application Publication No. 2006-210429 (hereinafter referred to as "Patent Document 4") includes an upper electrode arranged to enclose a laser emitting surface, and a mode selection filter formed of a transparent dielectric film designed to provide reflectivity of a central portion of the laser emission region differing from that of the peripheral portion of the emission region. Specifically, in the disclosed surface-emitting semiconductor laser, the reflectivity of the central portion is configured to be higher than that of the peripheral portion within the emission region in order to facilitate a basic transverse mode operation. As a result, the surface emitting semiconductor laser is capable of outputting a high basic mode laser beam. Or in another disclosed surface-emitting semiconductor laser, the reflectivity of the peripheral portion is configured to be higher than that of the central portion within the emission region in order to facilitate a higher-order transverse mode operation.

However, in the surface-emitting semiconductor laser disclosed in Patent Document 1, since the optimal aperture size of the opening of the upper electrode and the optimal aperture size of the current restriction part are both narrow, it is difficult to mass produce the surface emitting semiconductor laser. In particular, when the surface-emitting semiconductor lasers are configured to form a surface emitting semiconductor laser array, it is difficult to achieve uniform emitting properties of the plural emitting portions of the surface-emitting semiconductor laser array. Further, since a periphery of an emission region is shielded from light, there is a large loss in the basic transverse mode laser beam exhibiting optical intensity that degrades the high output power of the laser beam.

In the surface emitting semiconductor lasers disclosed in Patent Documents 2 through 4, since the filter is transparent, there is little loss in the basic transverse mode laser beam in the periphery of an emission region. However, in these surface-emitting semiconductor lasers disclosed in Patent Documents 2 through 4, it is difficult to obtain stable high laser output power, and the surface emitting semiconductor lasers have a short life-span.

The above disadvantages of the surface-emitting semiconductor lasers disclosed in Patent Documents 2 through 4 are examined, and the factor causing the disadvantages may be specified as heat generated by high electric resistance (hereinafter called "element resistance") of the surface-emitting semiconductor lasers.

SUMMARY OF THE INVENTION

It is a general object of at least one embodiment of the present invention to provide a surface-emitting laser element, a surface-emitting laser array, an optical scanner device and an image forming apparatus that substantially obviate one or more problems caused by the limitations and disadvantages of the related art.

In one embodiment, there is provided a surface-emitting laser element that includes: a resonator structure including an active layer; a first semiconductor multilayer mirror and a second semiconductor multilayer mirror configured to sandwich the resonator structure including the active layer; an electrode provided around an emission region of a light-emitting surface; and a first dielectric film provided in a peripheral portion within the emission region and outside a central portion of the emission region to make a reflectance of the peripheral portion lower than a reflectance of the central portion. In the surface-emitting laser element, an outer shape of a portion where the electrode provided around the emission region of the light-emitting surface is in contact with a contact layer includes corners.

In another embodiment, there is provided an optical scanner device for optically scanning a scanning surface that includes: a light source including a surface-emitting laser element; a deflector configured to deflect light emitted from the light source; and a scanning optical system configured to converge the light deflected by the deflector onto the scanning surface.

In another embodiment, there is provided an optical scanner device for optically scanning a scanning surface that includes: a light source including a surface-emitting laser array; a deflector configured to deflect light emitted from the light source; and a scanning optical system configured to converge the light deflected by the deflector onto the scanning surface.

In another embodiment, there is provided an image forming apparatus that includes: at least one image carrying member; and at least one of the optical scanner device that includes alight source having a surface-emitting laser element and the optical scanning device that includes the light source having a surface-emitting laser array configured to scan light modulated based on image information on the image carrying member.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

Figure 1:
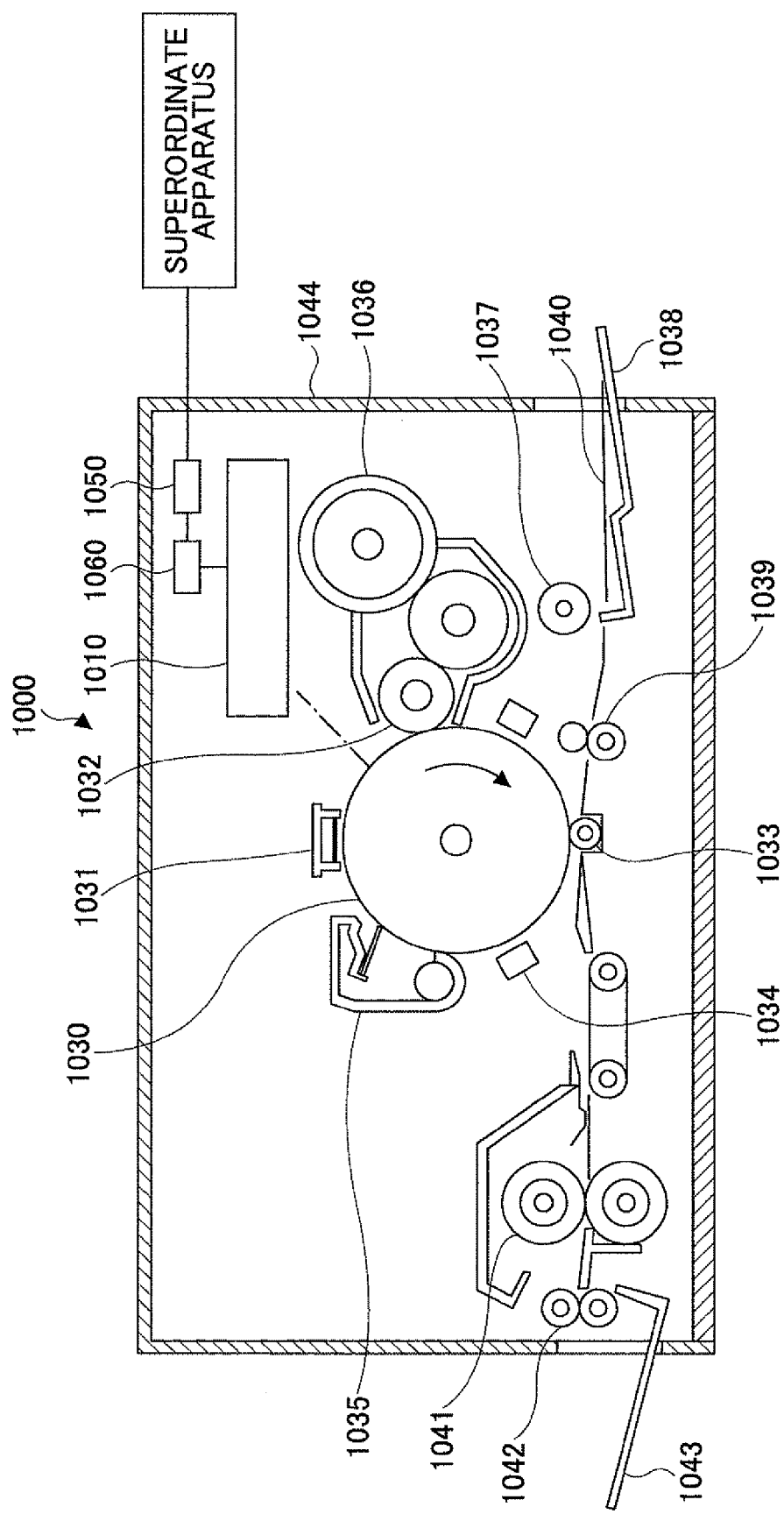
FIG. 1 is a schematic diagram illustrating a configuration of a laser printer according to an embodiment.

In the following, embodiments of the present invention will be described with reference to FIGS. 1 through 21. FIG. 1 is a schematic diagram illustrating a configuration of a laser printer 1000 according to an embodiment.

The laser printer 1000 includes an optical scanner device 1010, a photoreceptor drum 1030, an electrostatic charger 1031, a developing roller 1032, a transfer charger 1033, a static eliminator unit 1034, a cleaning unit 1035, a toner cartridge 1036, a paper feeding roller 1037, a paper feeding tray 1038, a resist roller pair 1039, a fixing roller 1041, a discharge roller pair 1042, a discharge tray 1043, a communication controller 1050, and a printer controller 1060 that performs overall control of these components of the laser printer 1000. Note that the above components are arranged in corresponding predetermined positions inside a printer case 1044.

The communication controller 1050 controls bidirectional communication with superordinate apparatuses such as personal computers via the network.

The photoreceptor drum 1030 is made of a cylindrical member having a photosensitive layer formed on its surface. That is, the surface of the photoreceptor drum 1030 is subject to scanning. The photoreceptor drum 1030 is configured to rotate in a direction indicated by an arrow in FIG. 1.

The electrostatic charger 1031, the developing roller 1032, the transfer charger 1033, the static eliminator unit 1034, and the cleaning unit 1035 are arranged near the surface of the photoreceptor drum 1030. More specifically, the electrostatic charger 1031, the developing roller 1032, the transfer charger 1033, the static eliminator unit 1034, and the cleaning unit 1035 are arranged in this order near the surface of the photoreceptor drum 1030 along a rotational direction of the photoreceptor drum 1030.

The electrostatic charger 1031 is configured to uniformly charge the surface of the photoreceptor drum 1030.

The optical scanner device 1010 scans the surface of the photoreceptor 1030 electrostatically charged by the electrostatic charger 1031 with luminous flux modulated based on image information acquired from the superordinate apparatuses to form a latent image corresponding to the acquired image information on the surface of the photoreceptor drum 1030. The latent image formed on the surface of the photoreceptor drum 1030 travels with the rotation of the photoreceptor drum 1030 in a direction toward the developing roller 1032. Note that a configuration of the optical scanner device 1010 is described later.

The toner cartridge 1036 contains toner, which is supplied to the developing roller 1032.

The developing roller 1032 applies the toner supplied from the toner cartridge 1036 to the latent image formed on the surface of the photoreceptor drum 1030 to make the latent image visible. Note that the latent image with the toner applied (hereinafter also called a "toner image" for convenience) travels with the rotation of the photoreceptor 1030 in a direction toward the transfer charger 1033.

The paper feeding tray 1038 contains sheets of recording paper 1040. The paper feeding roller 1037 is arranged near the paper feeding tray 1038 to pick one sheet of the recording paper 1040 from the paper feeding tray 1038 and then transfer the picked recording sheet 1040 to the resist roller pair 1039. The resist roller pair 1039 temporarily holds the recording sheet 1040 picked by the paper feeding roller 1037 and transfers it into a gap between the photoreceptor drum 1030 and the transfer charger 1033 with the rotation of the photoreceptor drum 1030.

The transfer charger 1033 has applied a voltage having a polarity opposite to the polarity of the toner such that the toner applied on the surface of the photoreceptor drum 1030 is electrically attracted by the recording sheet 1040. The toner image on the surface of the photoreceptor drum 1030 is thus transferred to the recording sheet 1040. The recording sheet 1040 having the transferred toner image is transferred to a fixing roller 1041.

The recording sheet 1040 on the fixing roller 1041 has heat and pressure applied so that the toner image is fixed on the recording sheet 1040. The recording sheet 1040 having the fixed toner image is transferred to the paper receiving tray 1043 via the discharge roller pair 1042 and sequentially stacked on the paper receiving tray 1043.

The static eliminator unit 1034 is configured to neutralize (discharge) the surface of the photoreceptor drum 1030.

The cleaning unit 1035 is configured to remove remaining toner from the surface of the photoreceptor drum 1030. The position of the surface of the photoreceptor drum 1030 from which the remaining toner is removed returns to a position that faces the electrostatic charger 1031.

Next, the configuration of the optical scanner device 1010 is described.

Figure 2:
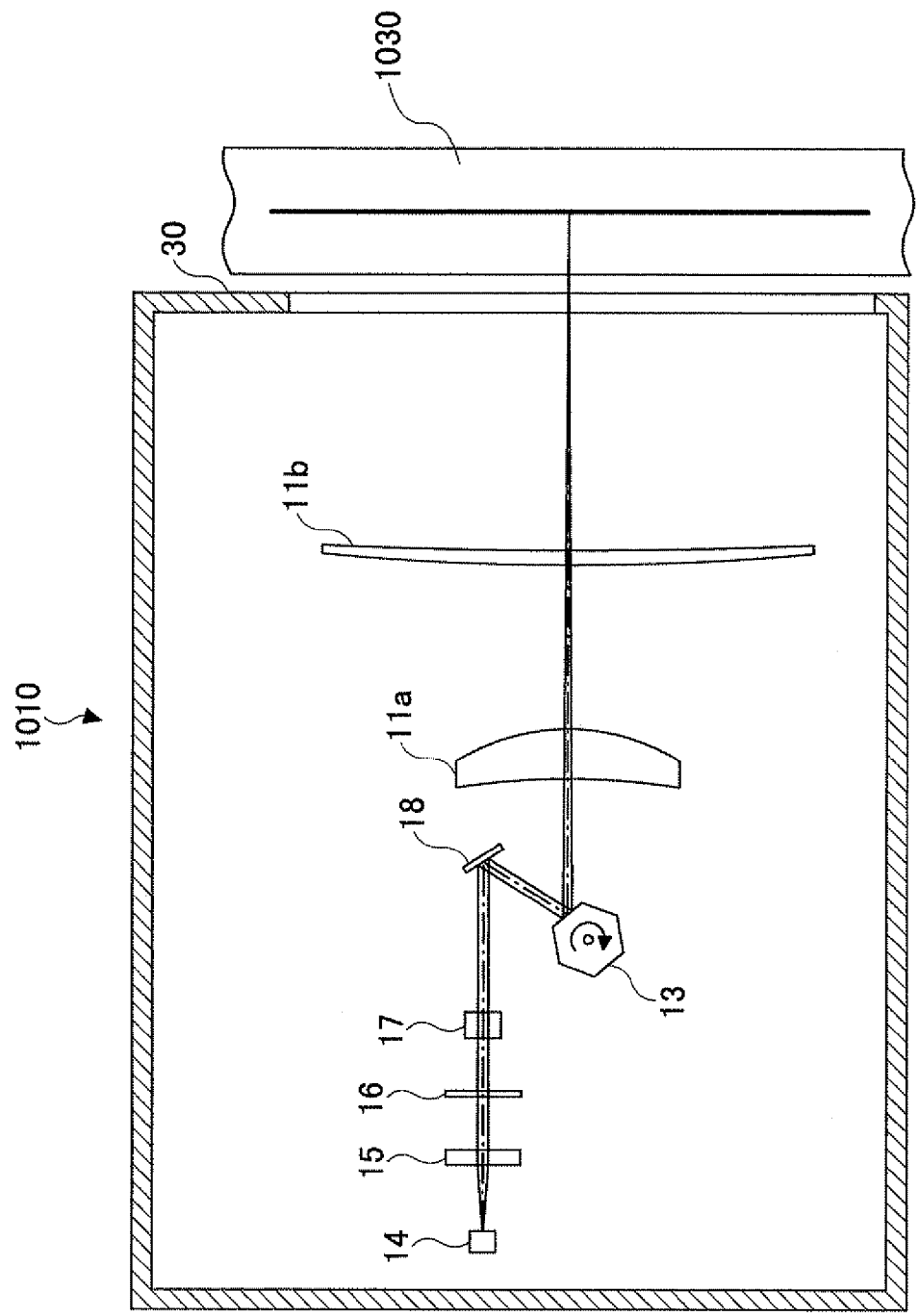
FIG. 2 is a schematic diagram illustrating an optical scanner device provided in the laser printer in FIG. 1.

As illustrated in FIG. 2, the optical scanner device 1010 includes a deflector-side scanning lens 11a, an image surface-side scanning lens 11b, a polygon mirror 13, a light source 14, a coupling lens 15, an aperture plate 16, a cylindrical lens 17, a reflecting mirror 18, and a scanning controller (not shown). These components of the optical scanner device 1010 are arranged in corresponding predetermined positions inside an optical housing 30.

Note that a direction corresponding to a main-scanning direction is hereinafter called a "corresponding main-scanning direction", and a direction corresponding to a sub-scanning direction is called a "corresponding sub-scanning direction" for convenience.

Further, the coupling lens 15 is provided to convert the luminous flux emitted from the light source 14 into approximately parallel light.

The aperture plate 16 having an aperture is provided to regulate a beam diameter of the luminous flux received via the coupling lens 15.

A cylindrical lens 17 is provided to form an image near a deflection reflecting surface in the corresponding sub-scanning direction with the luminous flux passing through the aperture of the aperture plate 16.

Further, an optical system provided in an optical path between the light source 14 and the polygon mirror 13 may also be called a deflector-side optical system. The deflector-side optical system according to the embodiment includes the coupling lens 15, the aperture plate 16, the cylindrical lens 17, and a reflecting mirror 18.

An example of the polygon mirror 13 has a hexahedral mirror having an inscribed circle with a radius of 18 mm, and respective portions of the hexahedral mirror function as the deflection reflecting surfaces. The polygon mirror 13 rotates at a constant velocity around a shaft arranged in parallel with the corresponding sub-scanning direction to polarize the luminous flux reflected from reflecting mirror 18.

The deflector-side scanning lens 11a is arranged in an optical path of the luminous flux deflected by the polygon mirror 13.

The image surface-side scanning lens 11b is arranged in the optical path of the luminous flux via the deflector-side scanning lens 11a. The luminous flux via the image surface-side scanning lens 11b is applied on the surface of the photoreceptor drum 1030 to form an optical spot. The optical spot travels with the rotation of the polygon mirror 13 in a longitudinal direction of the photoreceptor drum 1030. That is, the optical spot scans the surface of the photoreceptor drum 1030. The scanning direction of the optical spot is the "main-scanning direction". Further, the rotational direction of the photoreceptor drum 1030 is the "sub-scanning direction".

An optical system provided in an optical path between the polygon mirror 13 and the photoreceptor drum 1030 may also be called a "scanning optical system". The scanning optical system in this embodiment includes the deflector-side scanning lens 11a and the image surface-side scanning lens 11b. Note that at least one folded mirror may be arranged in at least one of the optical path between the deflector-side scanning lens 11a and the image surface-side scanning lens 11b and the optical path between the image surface-side scanning lens 11b and the photoreceptor drum 1030.

Figure 3:
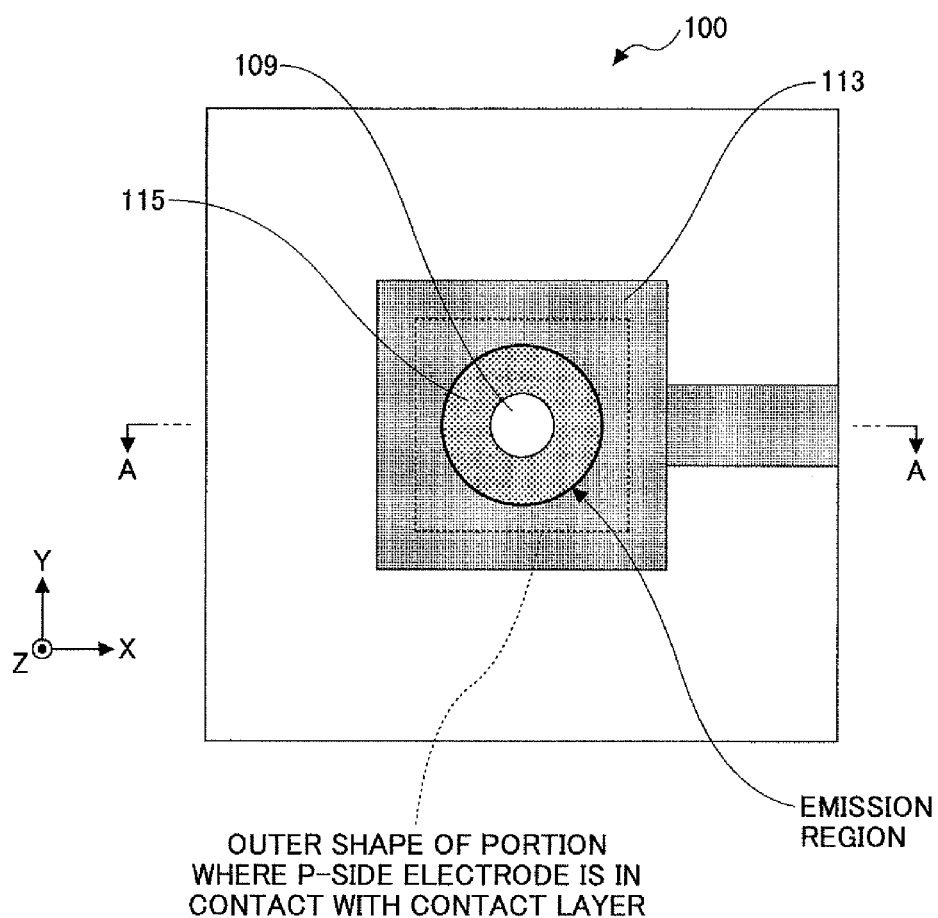
FIG. 3 is a diagram illustrating the surface-emitting laser element provided in a light source of the optical scanner device illustrated in FIG. 2.
Figure 4:
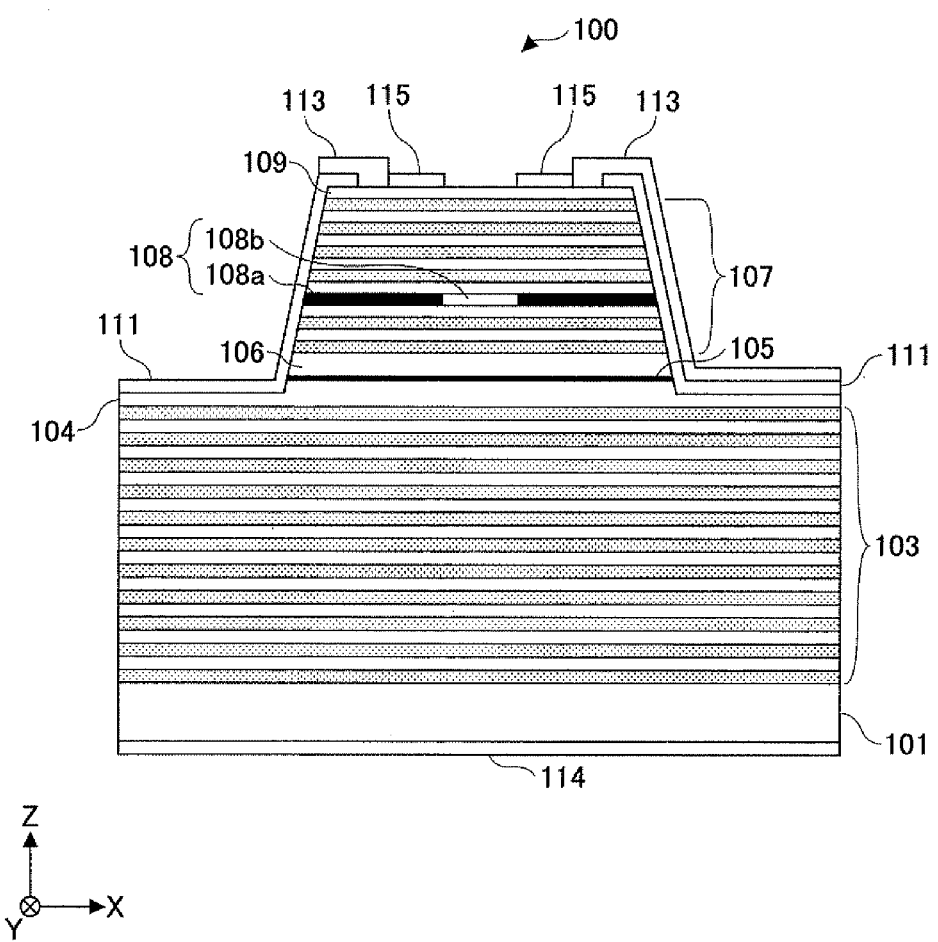
FIG. 4 is a cross-sectional diagram of the surface-emitting laser element of FIG. 3 cut along a line A-A.
Figure 5:
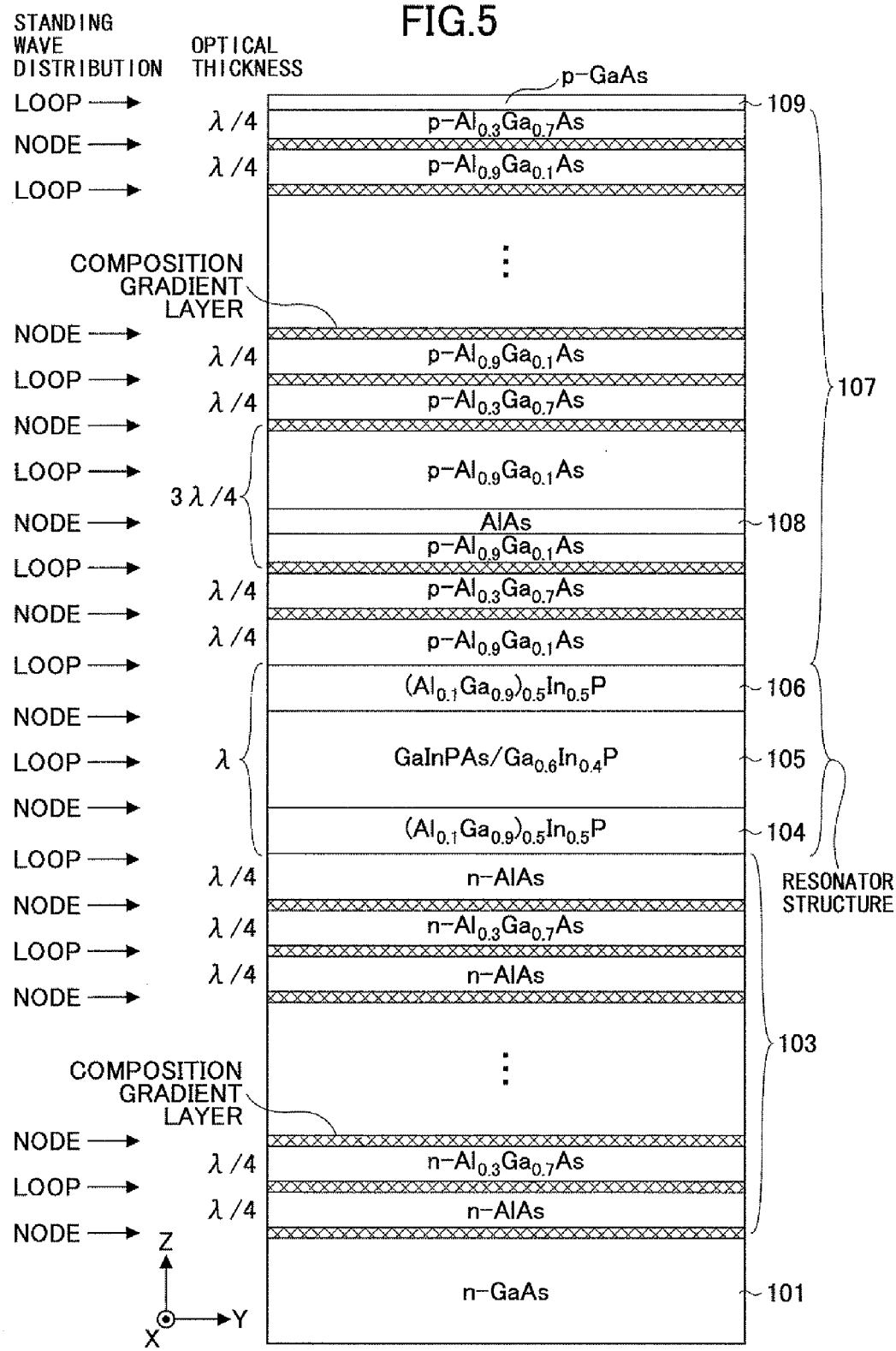
FIG. 5 is a diagram illustrating a stacked configuration of plural semiconductor layers of the surface-emitting laser element of FIG. 3.

The light source 14 may include a surface-emitting laser element 100 shown by examples in FIGS. 3 through 5. In this specification, a Z-axis direction is defined as a laser oscillation direction, and X-axis and Y-axis directions are defined as two mutually orthogonal directions perpendicular to the Z-axis direction in a surface. Note that FIG. 4 is a cross-sectional diagram of the surface-emitting laser element 100 illustrated in FIG. 3 cut along the line A-A.

The surface-emitting laser element 100 has a wavelength band of 780 nm, and is configured to include a substrate 101, a lower semiconductor DBR 103, a lower spacer layer 104, an active layer 105, an upper spacer layer 106, an upper semiconductor DBR 107, a contact layer 109, a p-side electrode 113, an n-side electrode 114, and a mode filter 115. The substrate 101 is a single crystal n-GaAs semiconductor substrate.

A lower semiconductor DBR 103 is stacked on a surface of the substrate 101 in the +Z direction via a buffer layer (not shown). The lower semiconductor DBR 103 has 40.5 pairs of refractive index layers each having a low refractive index layer made of an n-AlGaAs and a high refractive index layer made of an n-$Al_{0.3}Ga_{0.7}As$. A composition gradient layer having a thickness of 20 nm (not shown in FIG. 4, see FIG. 5) is provided between the low refractive index layer and the high refractive index layer for reducing electric resistance of the surface-emitting laser element 100 (hereinafter simply called "element resistance"). The composition gradient layers have a gradual compositional change from layer to layer. Each of the low refractive index layer and the high refractive index layer is arranged such that it includes ½ of the corresponding adjacent composition gradient layer and an optical thickness of $\lambda/4$ if the oscillation wavelength is defined as $\lambda$. Note that if the optical thickness is $\lambda/4$, the actual thickness D of the corresponding refractive index layer is $D=\lambda/4n$. Note that n represents a refractive index of a medium of that layer.

The lower spacer layer 104 is stacked on a surface of the lower semiconductor DBR 103 in the +Z direction. The lower spacer layer 104 is formed of a non-doped layer made of $(Al_{0.1}Ga_{0.9})_{0.5}In_{0.5}P$.

The active layer 105 is stacked on a surface of the lower spacer layer 104 in the +Z direction and has a triple quantum well structure having three triple quantum well layers and four barrier layers. Each of the quantum well layers includes a composition of GaInAsP that induces 0.7% compression strain and a band gap wavelength of 780 nm. Each of the barrier layers includes a composition of GaInP that induces 0.6% tensile strain.

The upper spacer layer 106 is stacked on a surface of the active layer 105 in the +Z direction. The upper spacer layer 106 is formed of a non-doped layer made of $(Al_{0.1}Ga_{0.9})_{0.5}In_{0.5}P$.

A portion including the lower spacer layer 104, the active layer 105 and the upper spacer layer 106 is called a resonator structure and includes an optical thickness of 1 wavelength. The active layer 105 is provided at a center of the resonator structure located corresponding to a position of a loop of a standing wave distribution of the electric field so as to obtain a high stimulated emission probability.

The upper semiconductor DBR 107 is stacked on a surface of the upper spacer layer 106 in the +Z direction. The upper semiconductor DBR 107 has 24 pairs of a low refractive index layer made of p-$Al_{0.9}Ga_{0.1}As$ and a high refractive index layer made of p-$Al_{0.3}Ga_{0.7}As$. A composition gradient layer (not shown in FIG. 4, see FIG. 5) is provided between the low refractive index layer and the high refractive index layer for reducing the element resistance. The composition gradient layers have a gradual compositional change from layer to layer. Each of the low refractive index layer and the high refractive index layer is arranged such that it includes ½ of the corresponding adjacent composition gradient layer and has an optical thickness of $\lambda/4$.

A selective oxidation layer 108 made of p-AlAs and having a thickness of 30 nm is inserted in one of the low refractive index layers of the upper semiconductor DBR 107. The inserted position of the selective oxidation layer 108 is a third wave node counted from the active layer 105 in the standing wave distribution of the electric field.

The contact layer 109 is stacked on a surface of the upper semiconductor DBR 107 in the +Z direction and is made of p-GaAs. With this configuration, the contact layer 109 is electrically conducted with the p-side electrode 113.

The mode filter 115 is made of a transparent dielectric film (i.e., first dielectric film) and formed within an emission region of the contact layer 109 in +Z direction. In this example, the mode filter 115 has a circular shape and is arranged to enclose a central portion of the emission region (i.e., the mode filter 115 is arranged around the central portion of the emission region). Accordingly, the reflectance of a peripheral region of the emission region covered with the mode filter 115 is lower than the reflectance of the central portion of the emission region.

Next, a method for fabricating the surface-emitting laser element 100 is briefly described. Note that a product obtained by stacking plural semiconductor layers on the substrate 101 is simply called a "stacked product".

Figure 6A:
FIGS. 6A and 6B are first example diagrams illustrating a method for fabricating the surface-emitting laser element of FIG. 3.

(Step S1) The above stacked product is obtained by crystal growth by metal organic chemical vapor deposition (MOCVD) or molecular beam epitaxy (MBE) as illustrated in FIG. 6A.

In the crystal growth by MOCVD, trimethylaluminum, trimethylgallium (TMG), and trimethylindium (TMI) are used as raw materials for III-Group, and phosphine ($PH_3$) and arsine ($AsH_3$) are used as raw materials for V-Group. In addition, carbon tetrabromide ($CBr_4$) and dimethylzinc (DMZn) are used as p-type dopant materials, and hydrogen selenide ($H_2Se$) is used as an n-type dopant material.

(Step S2) A square resist pattern (with 25 μm sides in this example) is formed on the surface of the stacked product.

(Step S3) A mesa structure (hereinafter simply called a "mesa" for convenience) having a quadrilateral pillar shape is formed using the above resist pattern as a photo mask by ECR etching using a Cl2 gas. A bottom surface of the etching is located in a middle of the lower spacer layer 104.

Figure 6B:
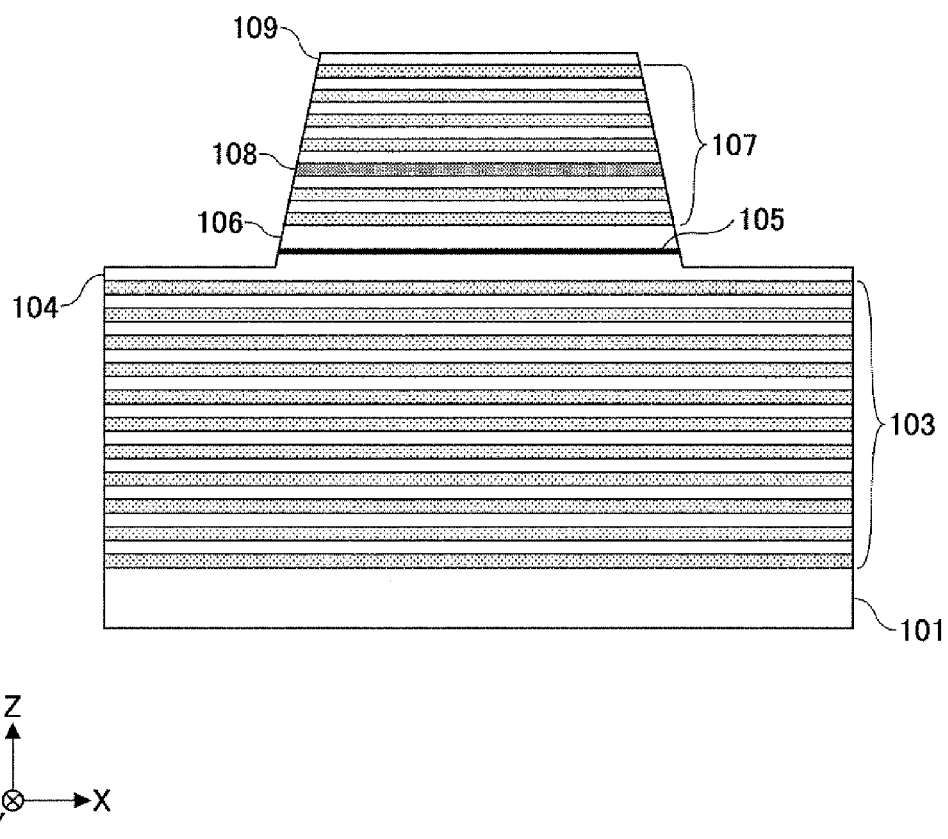

(Step S4) The photo mask is removed as illustrated in FIG. 6B.

Figure 7A:
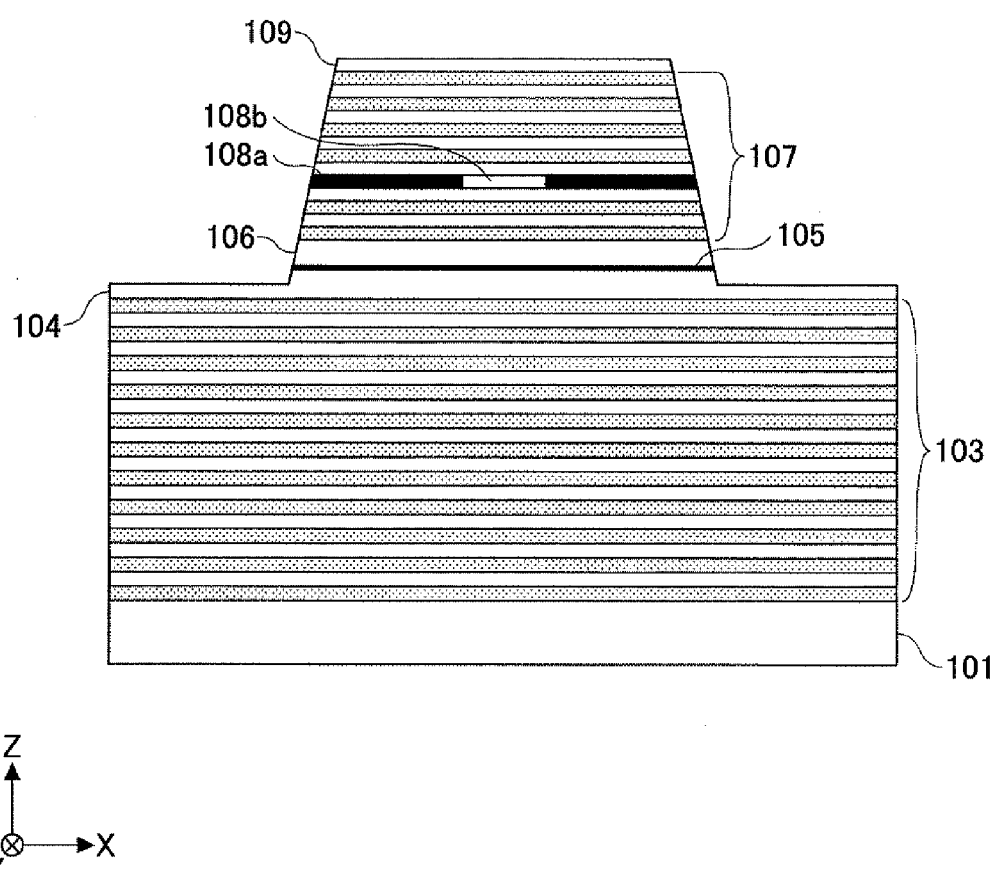
FIGS. 7A and 7B are second example diagrams illustrating a method for fabricating the surface-emitting laser element of FIG. 3.

(Step S5) The resulting stacked product is heat treated under water evaporation. With the heat treatment under the water evaporation, aluminum (Al) of the selective oxidation layer 108 is selectively oxidized from its outer periphery of the mesa so that a non-oxidized region 108b encircled by an Al oxide layer 108a remains at the center of the mesa as illustrated in FIG. 7A. That is, an oxide confined structure is formed to restrict a path for allowing the drive current of a light-emitting portion to pass through to a central portion of the mesa. The non-oxidized region 108b is the current passage region (current injection region). The approximately square current passage region having a width range of 4 to 6 µm is thus formed.

Figure 7B:
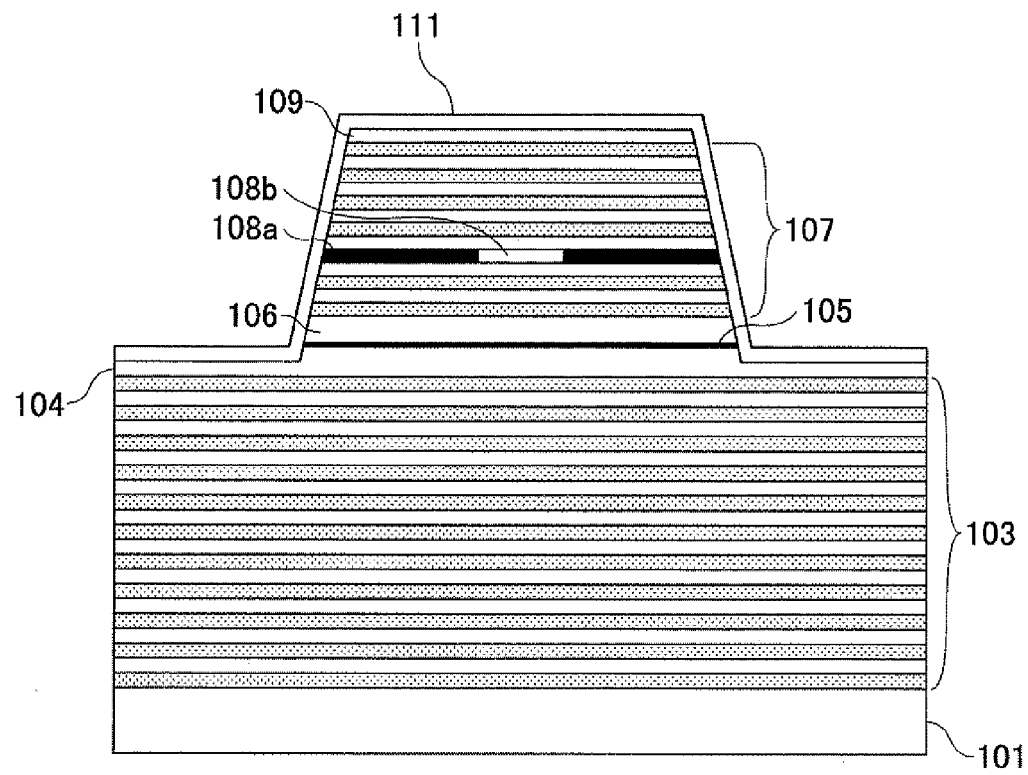
Figure 8:
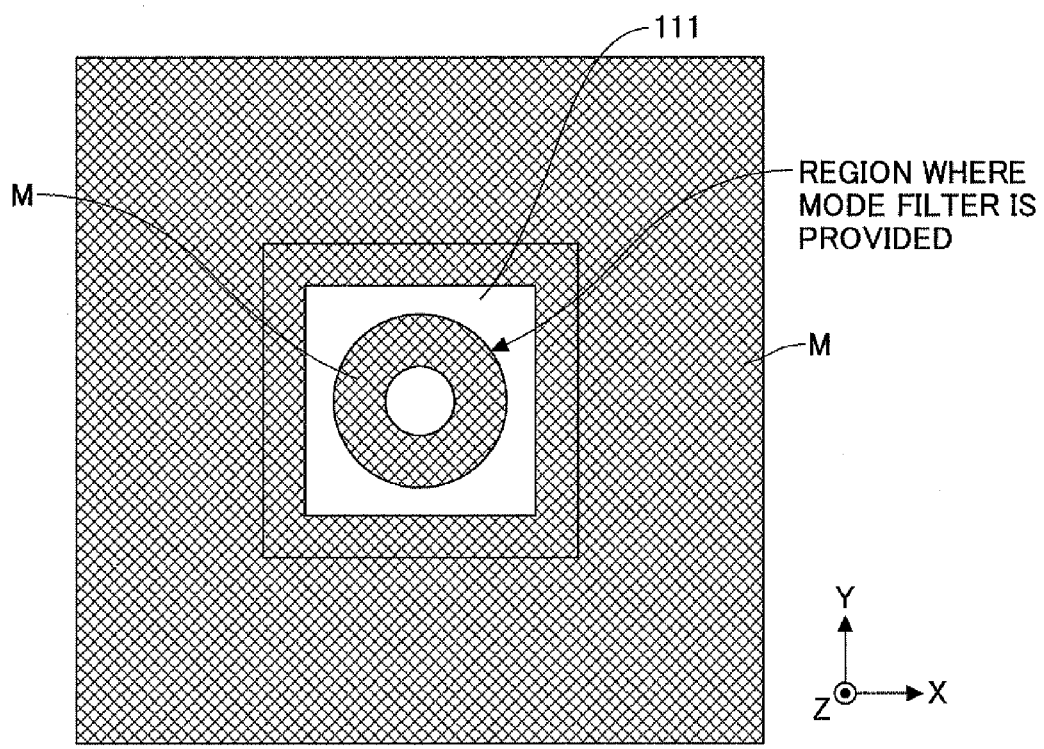
FIG. 8 is a diagram illustrating an example of an etching mask.
Figure 9:
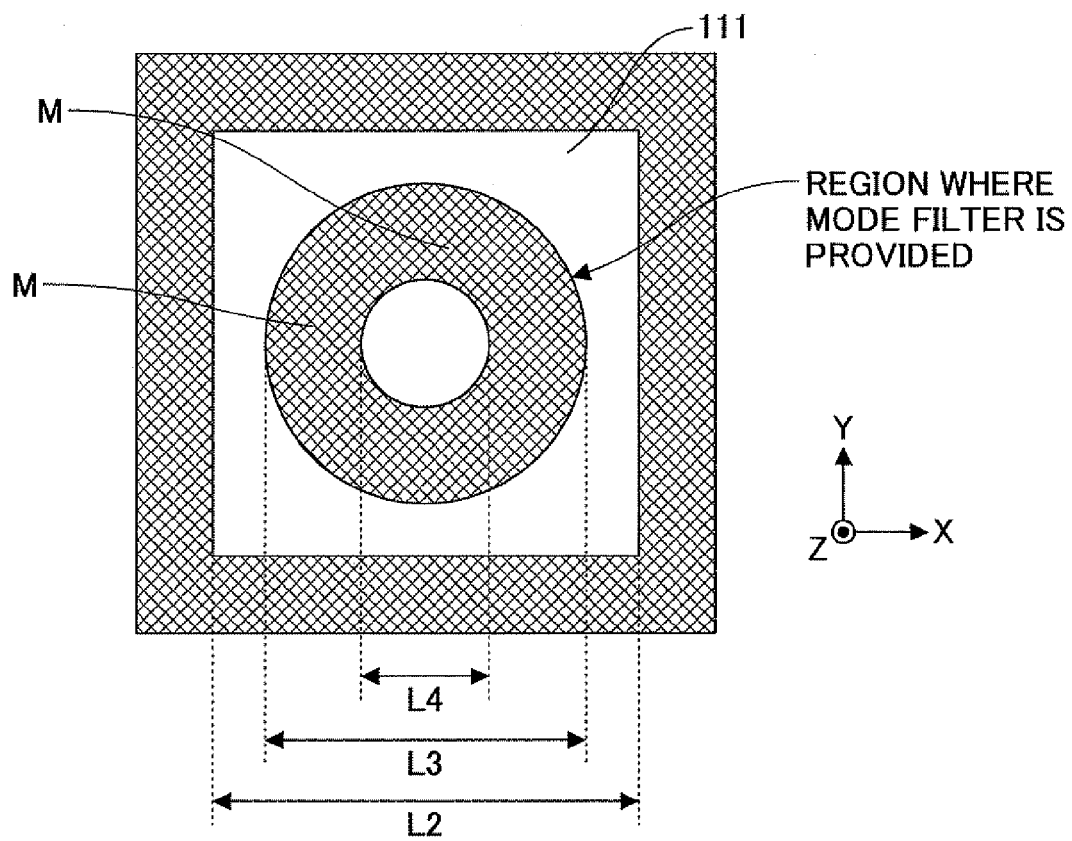
FIG. 9 is an enlarged diagram illustrating an upper surface of a mesa structure cut out of the surface-emitting laser element illustrated in FIG. 8.

(Step S6) A protection layer 111 made of SiN is formed over the entire surface of the stacked product by chemical vapor deposition (CVD) as illustrated in FIG. 7B. In this example, the protection layer 111 has an optical thickness of $\lambda/4$. Specifically, since a refractive index n of SiN is 1.86 and the oscillation wavelength $\lambda$ is 780 nm, the actual film thickness ($=\lambda/4$ n) of the protection layer 111 is determined as approximately 105 nm.

(Step S7) Etching masks (i.e., masks M) used for forming an opening for the p-side electrode contact are formed on an upper side of the mesa that is an emission surface of the laser beam. As illustrated in the mesa portion of FIG. 8 and an enlarged mesa portion in FIG. 9, masks M are formed in a circular region having an inner diameter L4 (i.e., 5 µm in this example) and an outer diameter L3 (13 µm in this example) where the mode filter 115 is to be provided in the peripheral portion of the mesa, and the peripheral portion of the upper surface of the mesa such that these masked portions are not etched. The width of the mode filter 115 is 4 µm. The outer shape of the contact region where the p-side electrode 113 is to be in contact with the contact layer 109 is a square having a length L2 (i.e., 20 µm in this example) on a side. The square contact region may have rounded corners.

(Step S8) The protection layer 111 is etched by buffered Hydrofluoric Acid (BHF) such that the protection layer 111 has an opening for a p-side electrode contact.

Figure 10A:
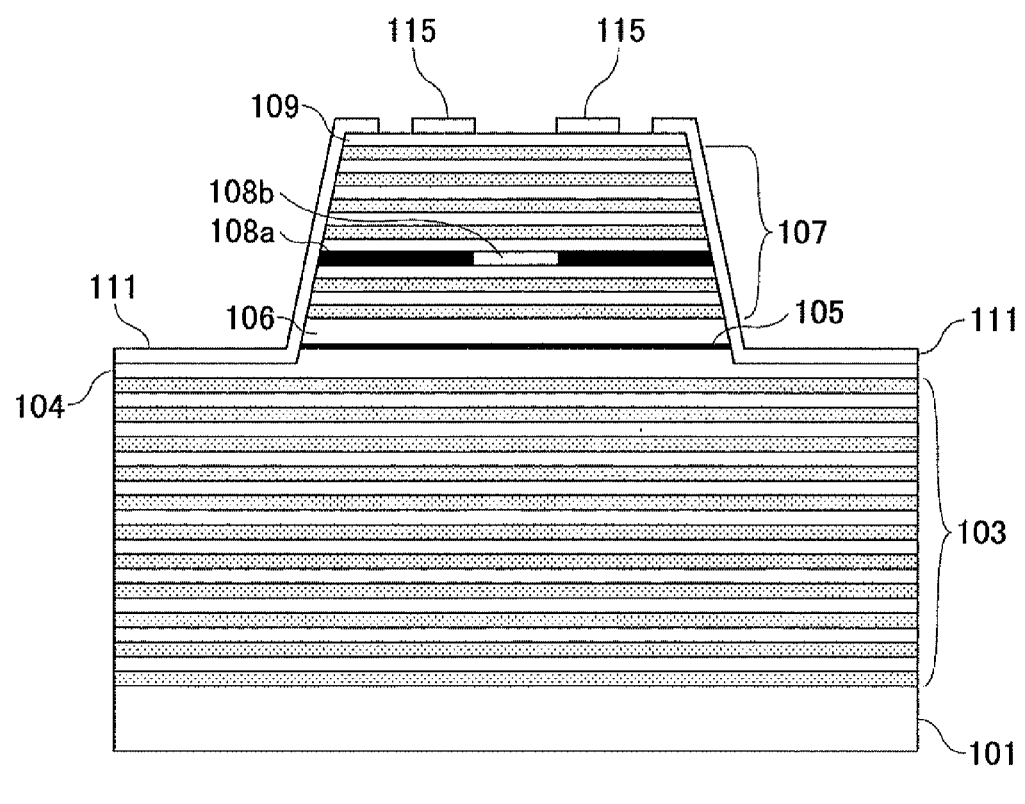
FIGS. 10A and 10B are third example diagrams illustrating a method for fabricating the surface-emitting laser element of FIG. 3.
Figure 10B:
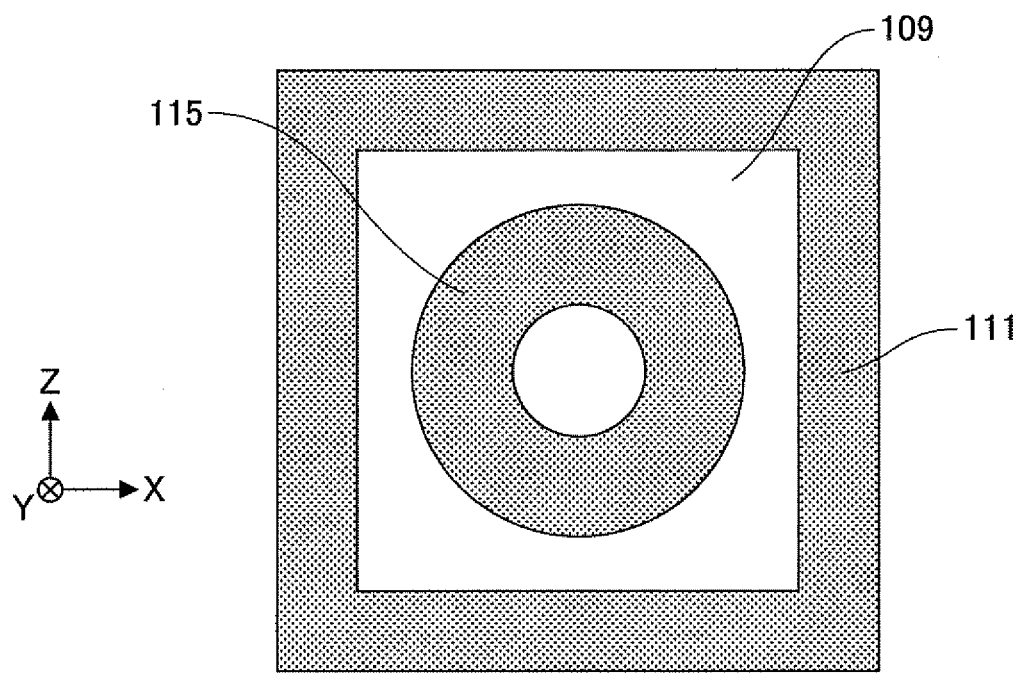

(Step S9) The masks M are then removed as illustrated in FIGS. 10A and 10B. Note that the protection layer remaining in the emission region corresponds to the mode filter 115.

(Step S10) A circular resist pattern having a diameter L3 (i.e., 13 µm in this example) is formed in a region corresponding to the light-emitting portion located at the upper side of the mesa to deposit a p-side electrode material. A multilayer film of Cr/AuZn/Au or a multilayer film of Ti/Pt/Au may be used as the p-side electrode material.

Figure 11A:
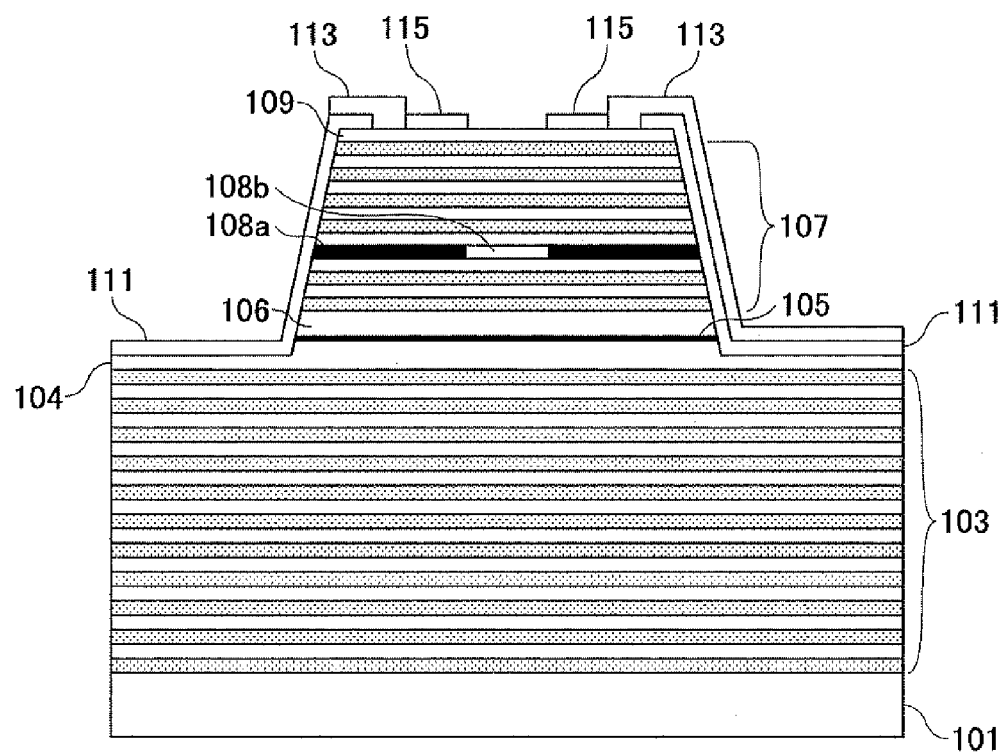
FIGS. 11A and 11B are fourth example diagrams illustrating a method for fabricating the surface-emitting laser element of FIG. 3.
Figure 11B:
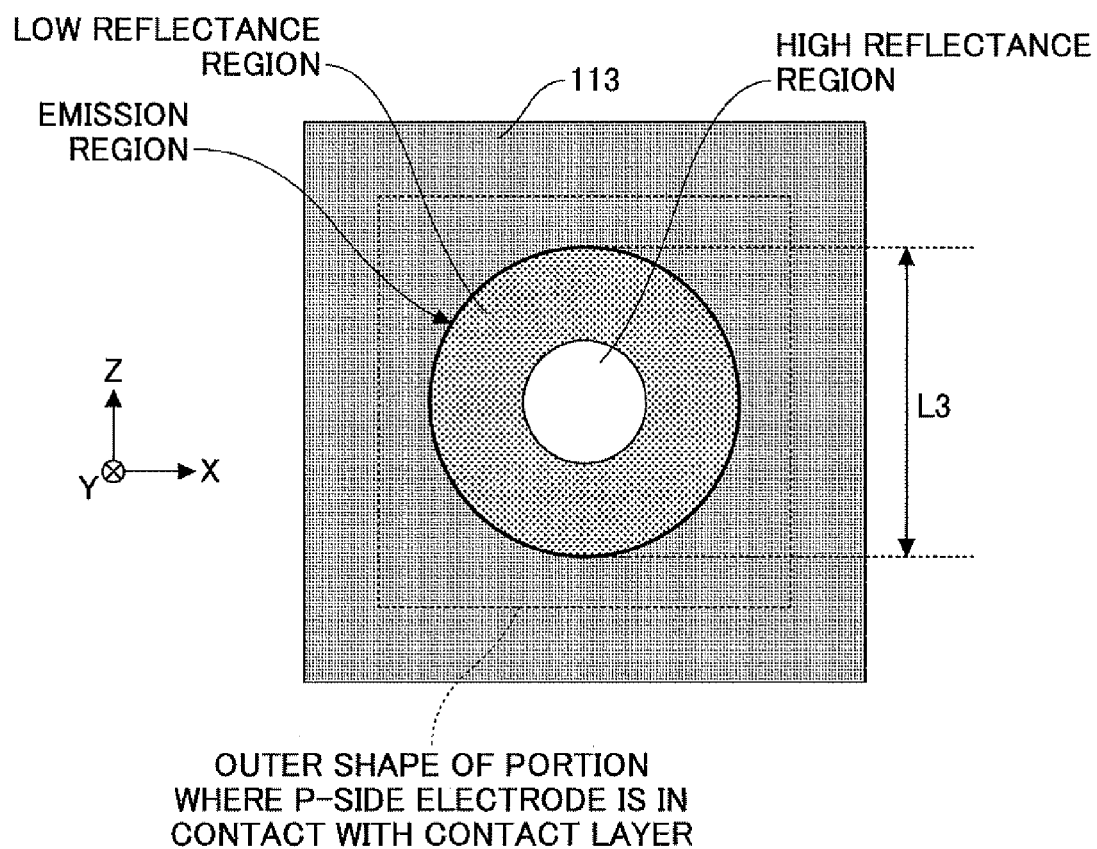

(Step S11) The electrode material deposited in the region (emission region) corresponding to the light-emitting portion is lifted off to form the p-side electrode 113 as illustrated in FIG. 11A. The region enclosed by the p-side electrode 113 is the emission region. Note that FIG. 11B is an enlarged diagram illustrating the mesa cut out of the mesa structure illustrated in FIG. 11A. The emission region has a circular shape having a diameter L3 (13 µm in this case). In this embodiment, the mode filter 115 is formed within the emission region as a transparent dielectric film made of SiN and having an optical thickness of $\lambda/4$. Accordingly, the reflectance of a region provided with the mode filter 115 within the emission region is lower than the reflectance of the central portion of the emission region. That is, in this embodiment, the emission region includes a low reflectance region (the peripheral portion of the emission region) and a high reflectance region (the central portion of the emission region) within the emission region.

Figure 12:
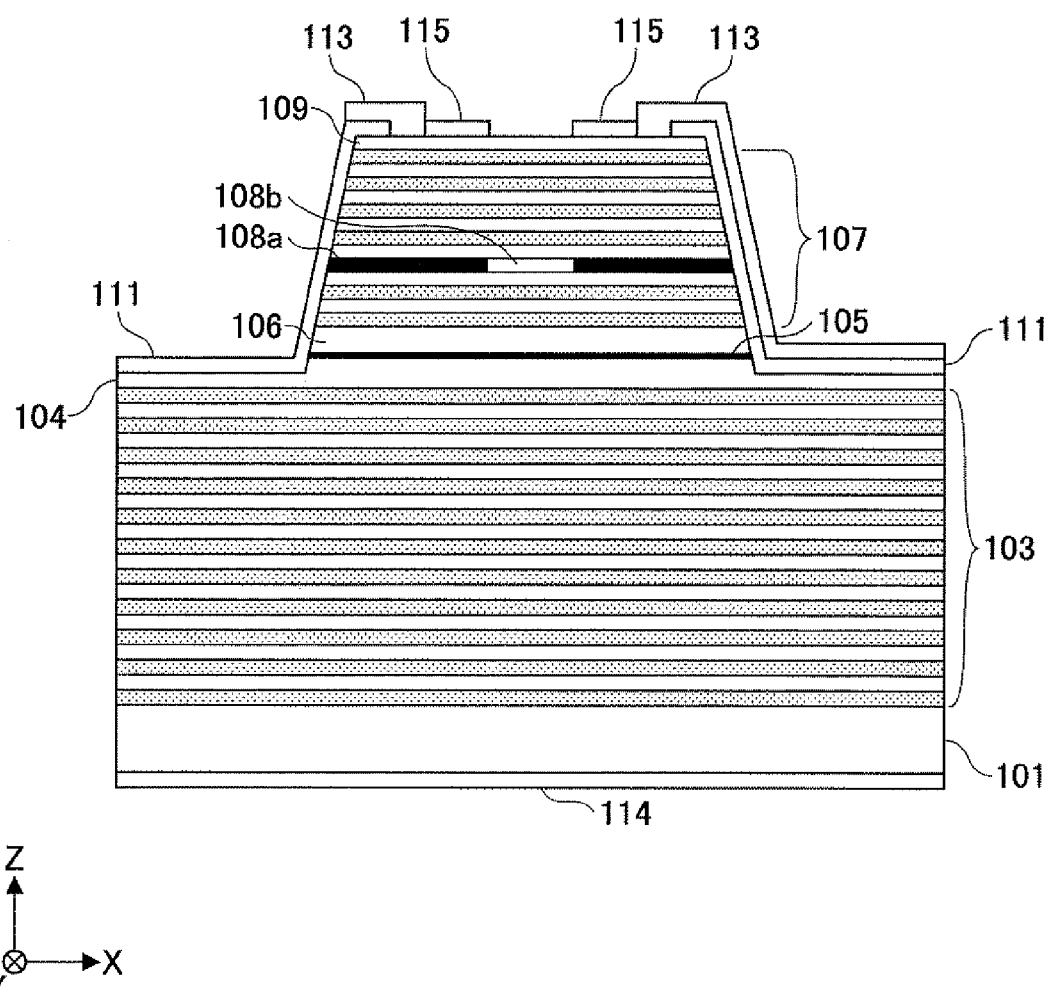
FIG. 12 is a fifth example diagram illustrating a method for fabricating the surface-emitting laser element of FIG. 3.

(Step S12) The backside of the substrate 101 is polished in a predetermined thickness (e.g., 100 µm), and the n-side electrode 114 is formed on a polished backside surface of the substrate 101 as illustrated in FIG. 12. In this example, the n-side electrode 114 is made of a multilayer film of AuGe/Ni/Au.

(Step S13) The ohmic conductivity of the p-side electrode 113 and the n-side electrode 114 is obtained by annealing. Thus, the mesa is formed as the light-emitting portion.

(Step S14) The obtained product is then cut into chips. Surface-emitting laser elements are thus fabricated.

Figure 13:
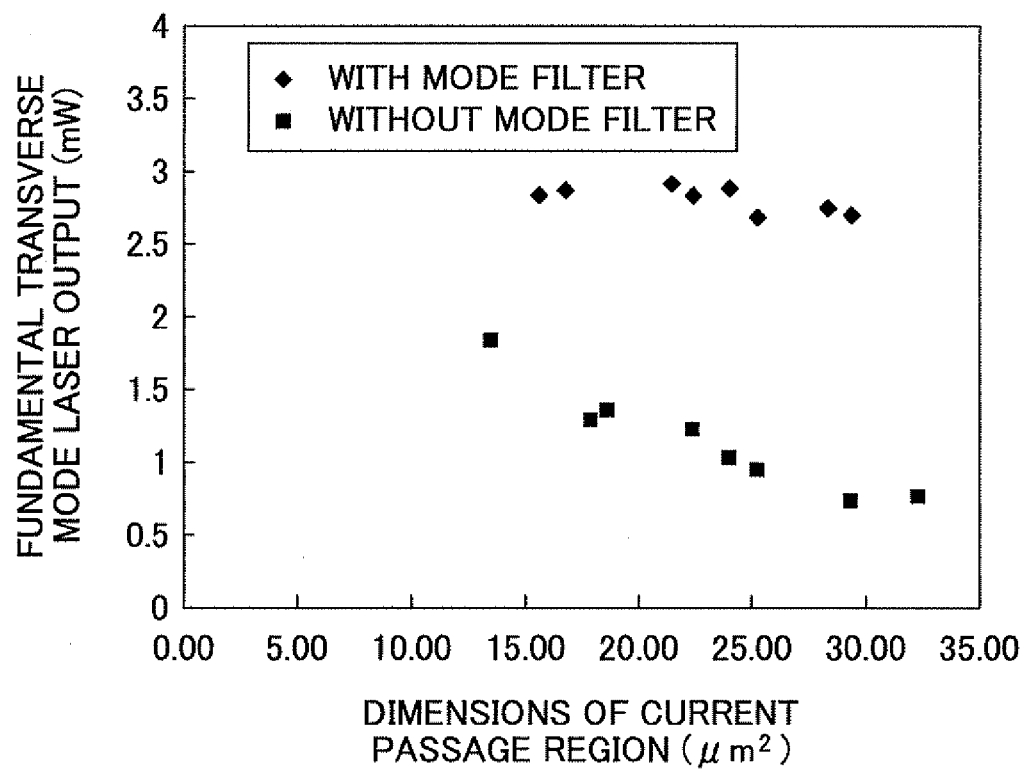
FIG. 13 is a graph illustrating an effect of a mode filter on a relationship between dimensions of a current passage region and laser output power in a basic transverse mode laser beam.

In the surface-emitting laser element 100 fabricated by the above method, a relationship between an optical output where an output ratio SMSR (Side Mode Suppression Ratio) of the basic transverse mode laser beam to the high-order transverse mode laser beam is 20 dB and the dimensions of the current passage region is computed. The results are shown in FIG. 13 together with the results of a Comparative Example. Note that if the surface-emitting laser element 100 is used in copiers or the like, it is preferable that SMSR be 20 dB or more.

As illustrated in FIG. 13, in the surface-emitting laser element of the Comparative Example (i.e., without a mode filter), the basic transverse mode laser beam output is significantly lowered with an increase in the dimensions of the current passage region. The above results were obtained because the higher order transverse mode laser beam output having an optical output peak may easily be oscillated in the peripheral region of the emission region.

However, the surface-emitting laser element 100 of the embodiment has the basic transverse mode laser beam output power higher than that of Comparative Example. Specifically, when the dimensions of the current passage region are 30 µm$^2$, the surface-emitting laser element 100 has the basic transverse mode laser beam output of 2.5 mW or more.

If the dimensions of the current passage region are small, current density of the surface-emitting laser element 100 is high, and element resistance is high while operation, which may degrade heat properties of the surface-emitting laser element 100. The life-span of the surface-emitting laser element 100 may also be reduced. Note that if the surface-emitting laser element 100 is used in copiers or the like, it is preferable that the basic transverse laser beam output be 1 mW or more.

As illustrated in FIG. 13, in the Comparative Example (i.e., without a mode filter), the dimensions of the current passage region corresponding to the basic transverse mode laser output of 1 mW or more are small. Accordingly, in the Comparative Example, it may be difficult to uniformly produce the current passage region having the same dimensions with excellent reproducibility, thereby resulting in an inferior yield.

By contrast, in the surface-emitting laser element 100 of the embodiment, the dimensions of the current passage region corresponding to the basic transverse mode laser output of 1 mW or more are large. Thus, the dimensions of the current passage region may be increased while maintaining the high basic transverse mode laser output. Accordingly, the surface-emitting laser element 100 having low element resistance, excellent heat properties, a long life-span, and superior yield may be obtained.

Generally, an optical output in the basic transverse mode may be the highest near the center of the emission region and be gradually lowered toward the periphery of the emission region. By contrast, an optical output in a higher-order transverse mode may be highest in the peripheral portion of the emission region. In general, laser output in a primary higher-order transverse mode may be oscillated subsequent to the basic transverse mode. The laser output in the primary higher-order transverse mode is the highest in the peripheral portion of the emission region and gradually lowers toward the center of the emission region. In the surface-emitting laser element 100 of the embodiment, since the reflectance of the peripheral portion is lower than the reflectance of the central portion of the emission region, the oscillation in the higher-order transverse mode may be controlled by lowering the reflectance corresponding to the higher-order transverse mode laser output without lowering the basic transverse mode laser output.

Figure 14:
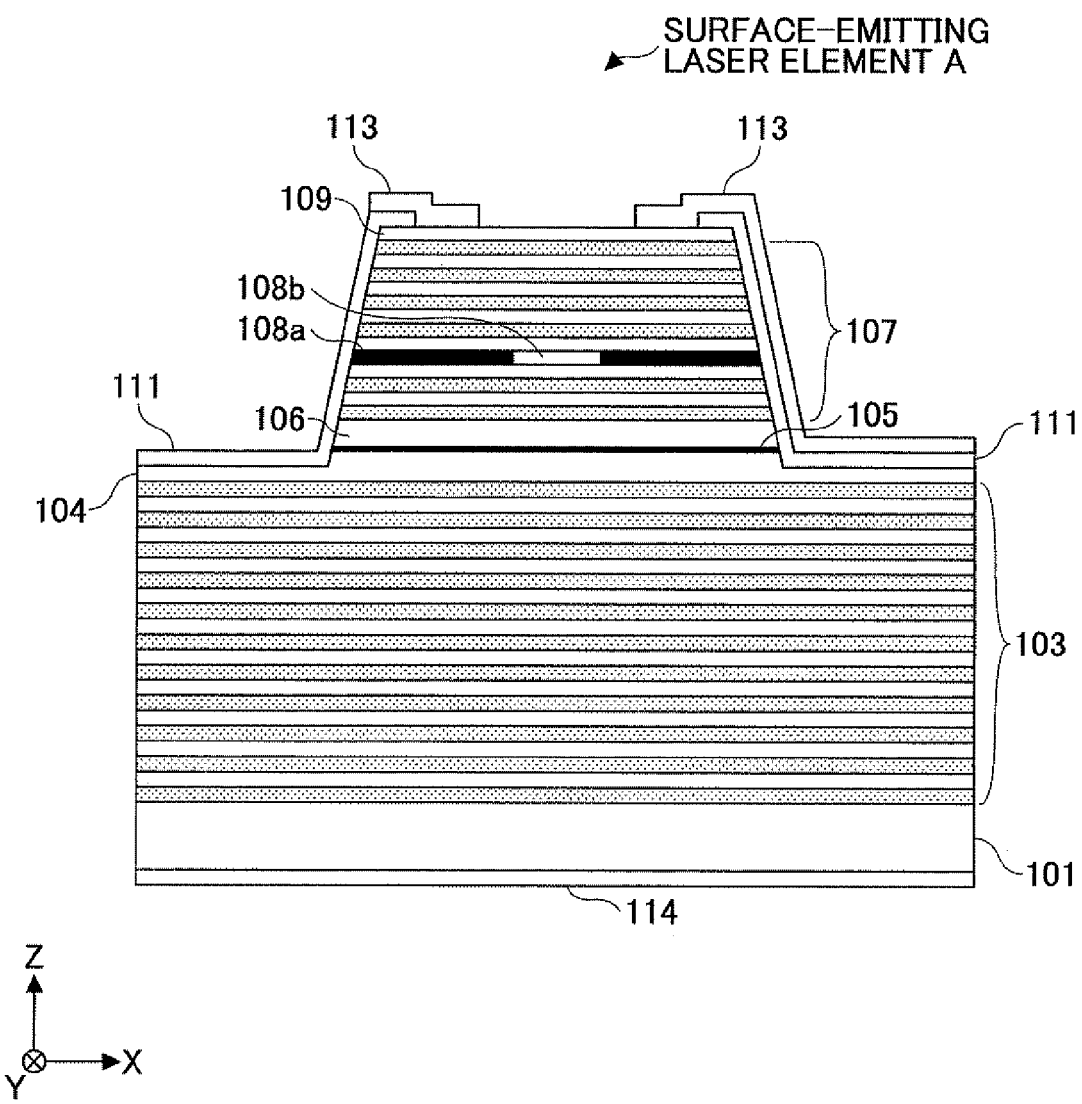
FIG. 14 is a first example diagram illustrating a related art surface-emitting laser element A.
Figure 15:
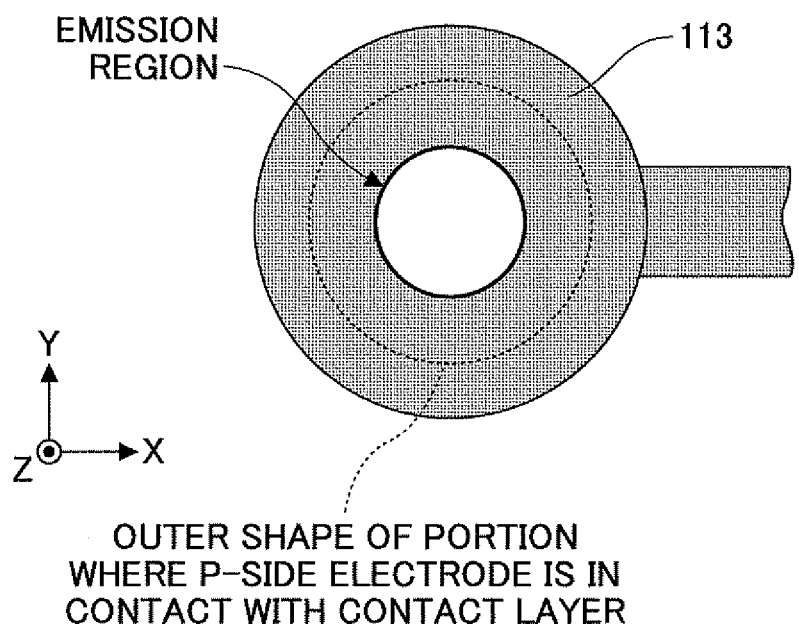
FIG. 15 is a second example diagram illustrating the related art surface-emitting laser element A.

FIGS. 14 and 15 illustrate a standard related art surface-emitting laser element A having no mode filter.

Figure 16:
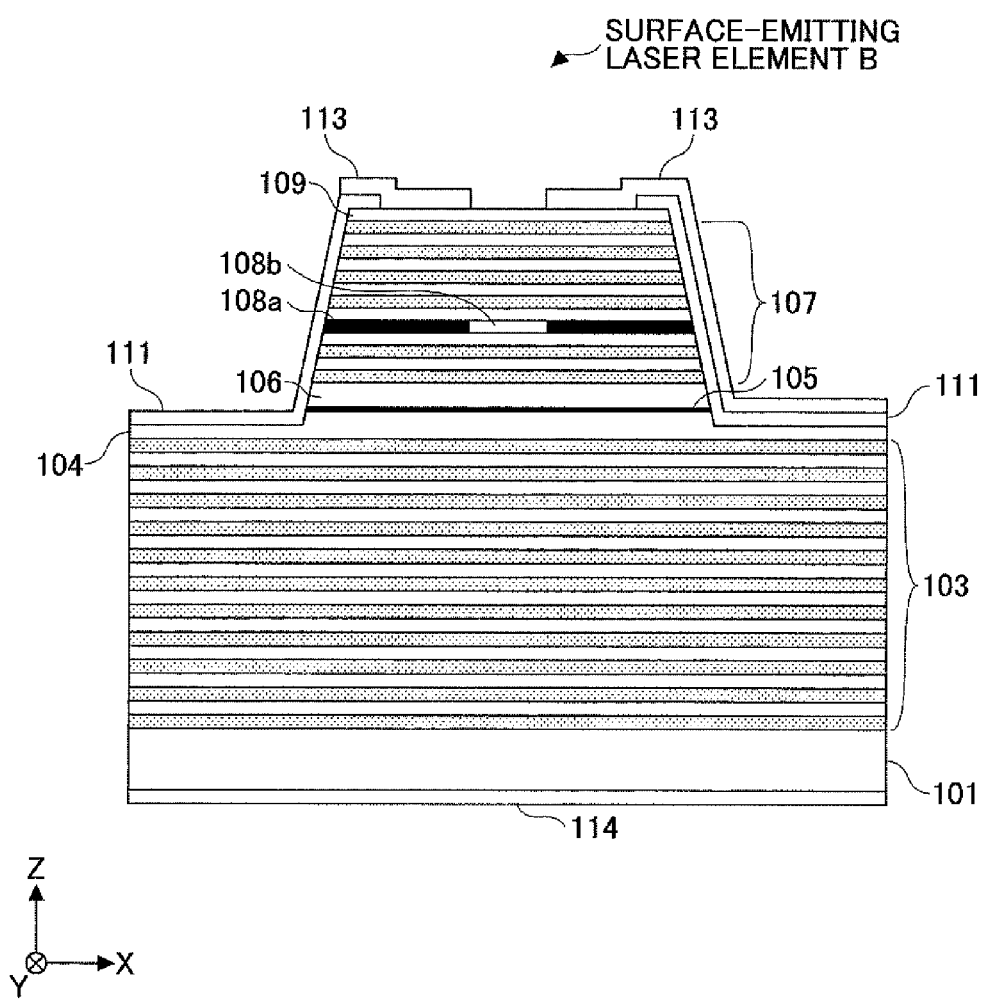
FIG. 16 is a first example diagram illustrating a related art surface-emitting laser element B.
Figure 17:
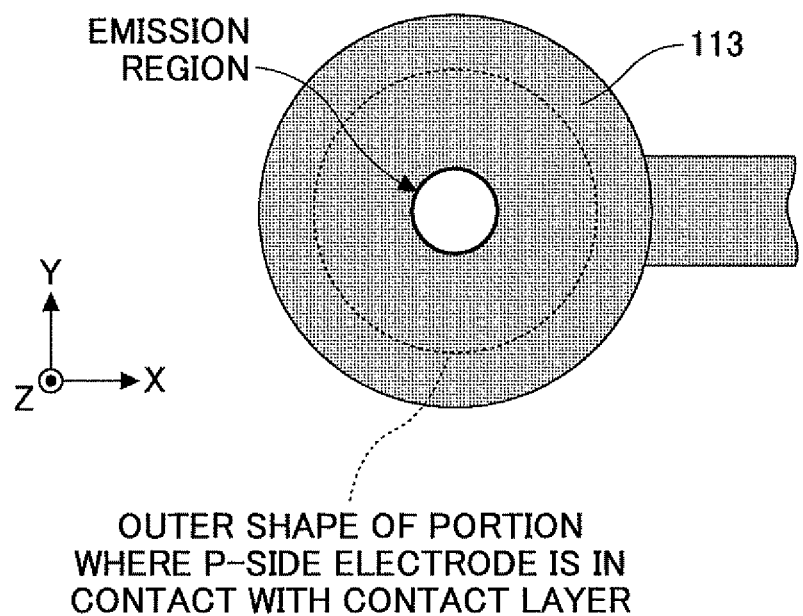
FIG. 17 is a second example diagram illustrating the related art surface-emitting laser element B.

FIGS. 16 and 17 illustrate a related art surface-emitting laser element B having an aperture size for an electrode smaller than that of the related art surface-emitting laser element A (see Patent Document 1). The related art surface-emitting laser element B is capable of controlling the higher-order transverse mode laser output compared to the related art surface-emitting laser element A. The related art surface-emitting laser element B has a large contact area where the p-side electrode 113 is in contact with the contact layer 109 and a low element resistance compared to those of the related art surface-emitting laser element A. However, in the related art surface-emitting laser element B, the peripheral portion of the emitting-surface is completely shielded with metal, and the laser output power is therefore decreased.

Figure 18:
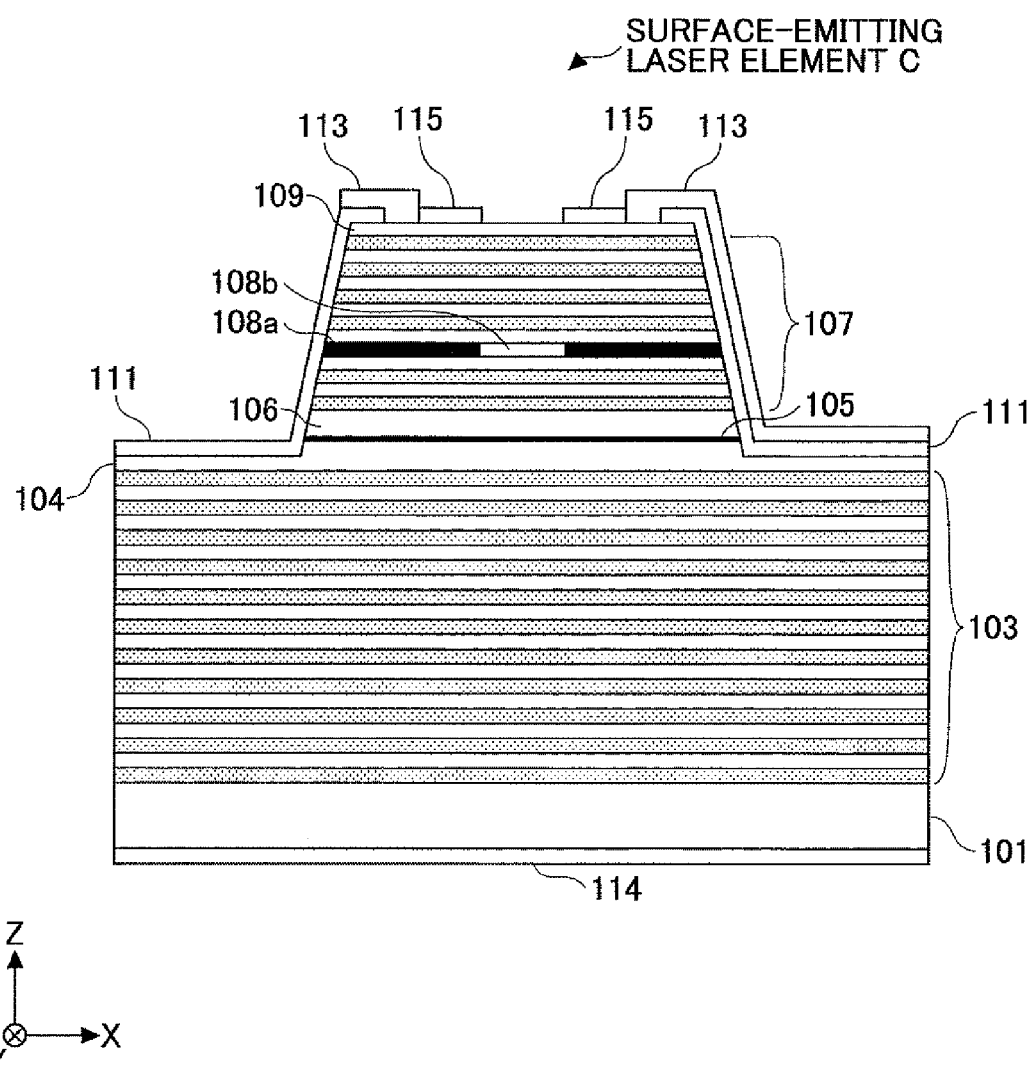
FIG. 18 is a first example diagram illustrating a related art surface-emitting laser element C.
Figure 19:
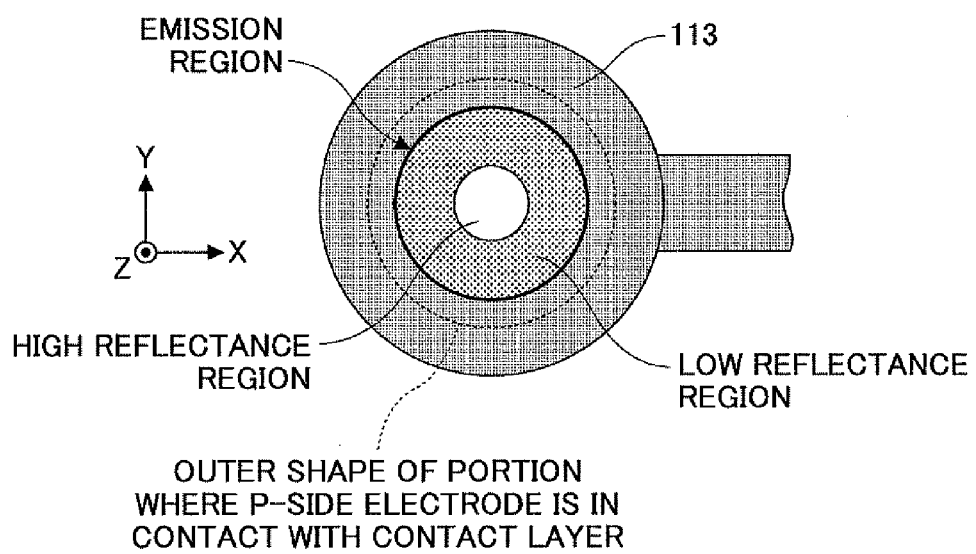
FIG. 19 is a second example diagram illustrating the related art surface-emitting laser element C.
Figure 20:
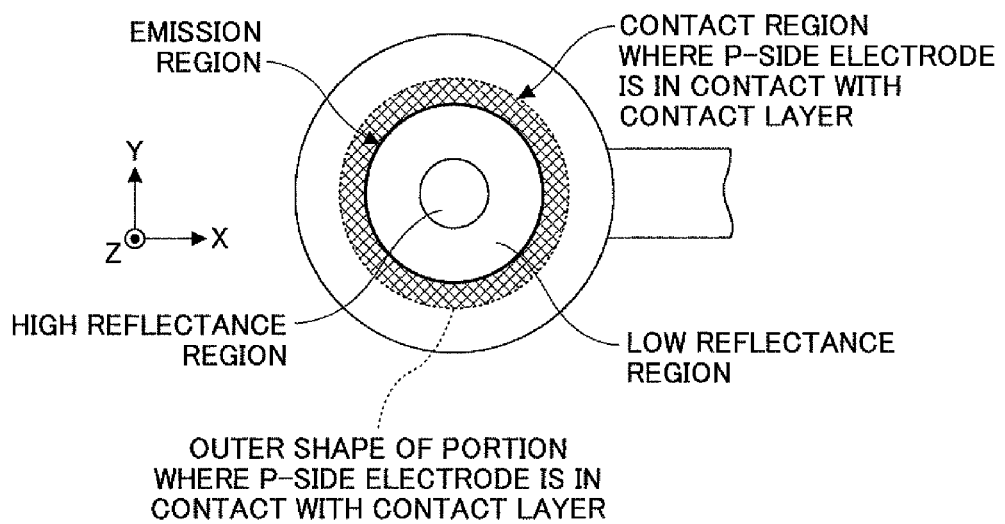
FIG. 20 is a diagram illustrating a contact region where a p-side electrode is in contact with a contact layer provided in the related art surface-emitting laser element C.

FIGS. 18 and 19 illustrate a related art surface-emitting laser element C having a mode filter made of a dielectric film (see Patent Documents 2 through 4). The related art surface-emitting laser element C has the mode filter 115 made of a transparent dielectric film, so that the basic transverse mode laser output is higher than that of the related art surface-emitting laser element B. However, as illustrated in FIG. 20, since a contact region where the p-side electrode 113 is in contact with the contact layer 109 has a circular shape having a width of 3.5 μm, the dimensions of the contact region are small, and the element resistance is high.

Figure 21:
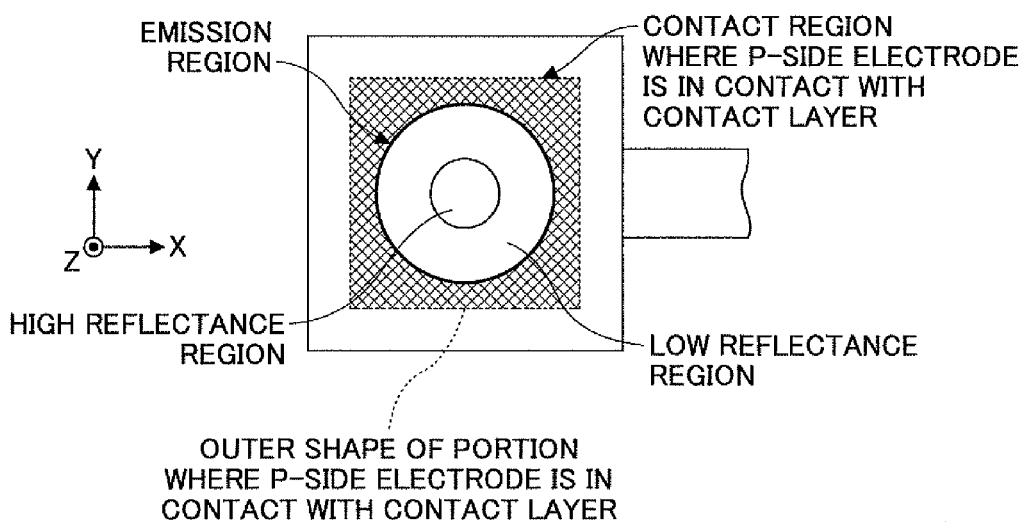
FIG. 21 is a diagram illustrating a contact region where a p-side electrode is in contact with a contact layer provided in the surface-emitting laser element according to the embodiment illustrated in FIG. 3.

By contrast, as illustrated in FIG. 21, in the surface-emitting laser element 100 of the embodiment, since an outer shape of a contact region where the p-side electrode 113 is in contact with the contact layer 109 is a non-circular shape having corners (a square shape in the example of FIG. 21), the dimensions of the contact region are larger than those of the surface-emitting laser element C. Accordingly, the surface-emitting laser element 100 is capable of lowering element resistance (i.e., electric resistance of the surface-emitting laser element) while operating in a high power single transverse mode. Note that a mesa width of the surface-emitting laser element 100 in FIG. 21 is the same as the mesa width (i.e., the diameter) of the surface-emitting laser element C in FIG. 20.

Note that if a sufficiently large contact region where the p-side electrode 113 is in contact with the contact layer 109 is obtained in the surface-emitting laser element C, the dimensions of the upper surface of the mesa may be increased. Accordingly, it may be difficult to arrange and integrate the surface-emitting laser elements C at a narrow pitch to form a surface-emitting laser array. Further, in the surface-emitting laser element 100 of the embodiment, since an oxidation distance for selective oxidation processing is long, it may be difficult to control the shape and the dimensions of the current passage region, and the yield may be lowered.

As described above, the surface-emitting laser element 100 according to the embodiment includes the substrate 101, the lower semiconductor DBR 103, the lower spacer layer 104, and the active layer 105, the upper semiconductor DBR 107 and the contact layer 109 stacked on the substrate 101. In the surface-emitting laser element 100 according to the embodiment, the p-side electrode 113 is provided around the emission region of an emission surface from which a laser beam is emitted. The mode filter 115 made of an optically transparent dielectric film having an optical thickness of λ/4 is formed around the central portion of the emission region.

An outer shape of a portion where the p-side electrode 113 is in contact with the contact layer 109 is a shape that includes corners (angles). In this case, the dimensions of the contact area where the p-side electrode 113 is in contact with the contact layer 109 may be increased without increasing the dimensions of the upper surface of the mesa. Accordingly, the surface-emitting laser element 100 is capable of lowering element resistance (i.e., electric resistance of the surface-emitting laser element) while operating in a high power single transverse mode. Thus, the surface-emitting laser element 100 may have a life-span longer that that of the related art surface-emitting laser element.

In the optical scanner device 1010 according to the embodiment, since the light source 14 includes the surface-emitting laser element 100, the optical scanner device 1010 may be capable of stably carrying out optical scanning with high accuracy.

Since the laser printer 1000 according to the embodiment includes the optical scanner device 1010, the laser printer 1000 may be capable of forming images with high quality.

Note that in the above embodiment, the outer shape of a region where the p-side electrode 113 is in contact with the contact layer 109 is a square shape; however, the outer shape of such a region is not limited to the square shape and the outer shape of the region may be any of quadrangle shapes. For example, the outer shape of the region where the p-side electrode 113 is in contact with the contact layer 109 may be a rectangular shape. Alternatively, the outer shape of the region where the p-side electrode 113 is in contact with the contact layer 109 may be a polygonal shape having four or more corners (e.g., an octagon). In this case, the outer shape of the region where the p-side electrode is in contact with the contact layer 109 may be a polygon having an inscribed circle that is an outer shape of the related art contact region where the p-side electrode is in contact with the contact layer. With this configuration, the dimensions of the contact area where the p-side electrode 113 is in contact with the contact layer 109 may be increased without increasing the dimensions of the mesa.

Further, the laser printer 1000 according to the embodiment includes the protection layer 111 made of SiN. However, the protection layer 111 may not be limited to SiN. The protection layer 111 may be made of any one of SiNx, SiOx, TiOx, and SiON. Thus, the effect similar to that of the material SiN may be obtained by designing the film thickness based on the corresponding refractive index of the selected material.

Further, in the above embodiment, the mode filter 115 has a circular shape that encloses the central portion of the emission region; however, the mode filter 115 is not limited to the circular shape.

Figure 22:
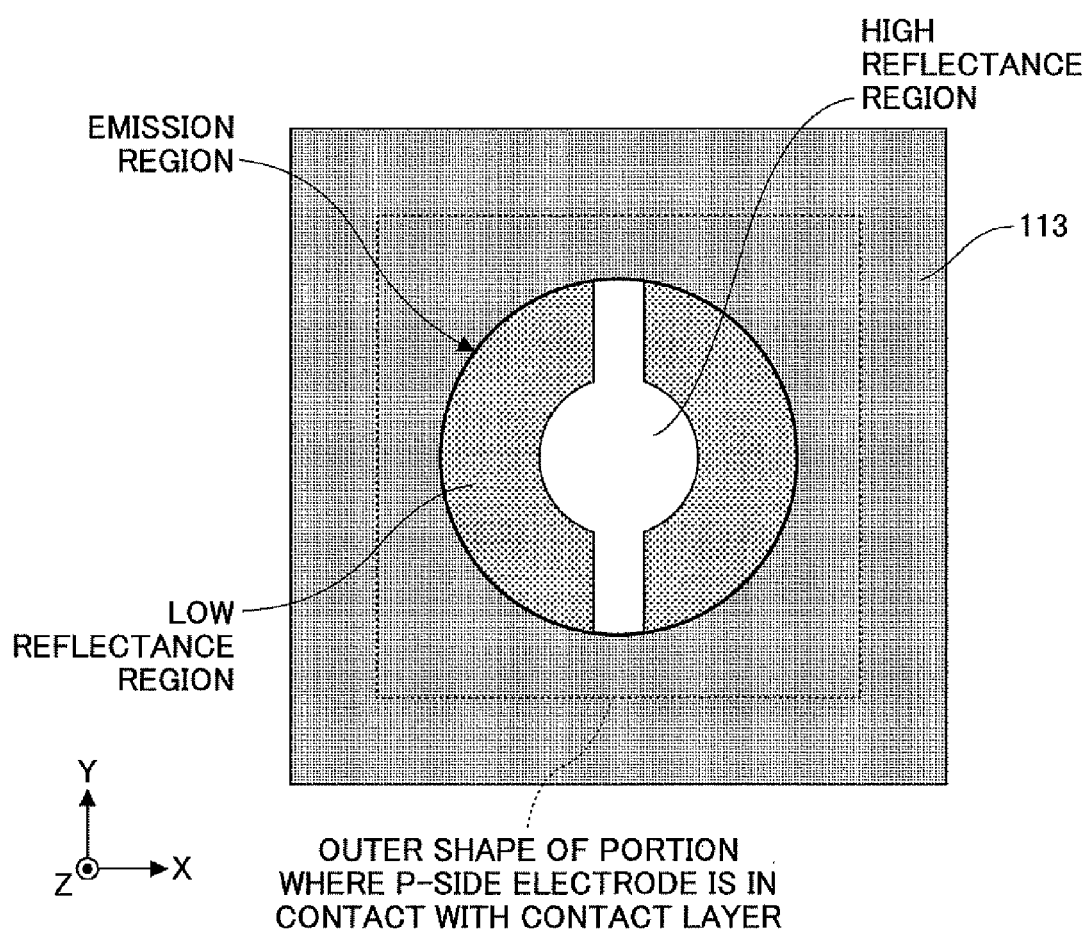
FIG. 22 is a diagram illustrating a first modification of a mode filter.

For example, as illustrated in FIG. 22, the mode filter 115 may be provided in two mutually facing sub-regions that sandwich the central portion of the emission region in an X-axis direction and that are located outside the central portion of the emission region.

Figure 23A:
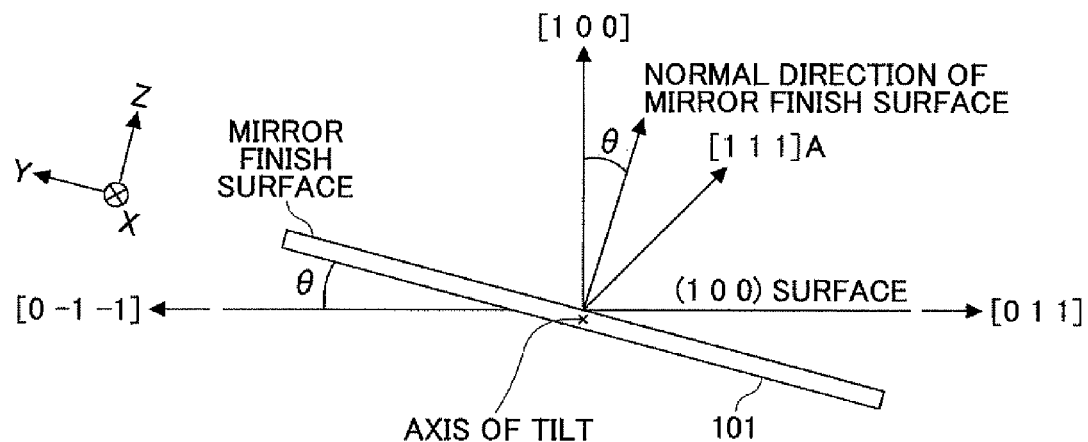
FIGS. 23A and 23B are diagrams each illustrating a slanted substrate of the surface-emitting laser element according to the embodiment.
Figure 23B:
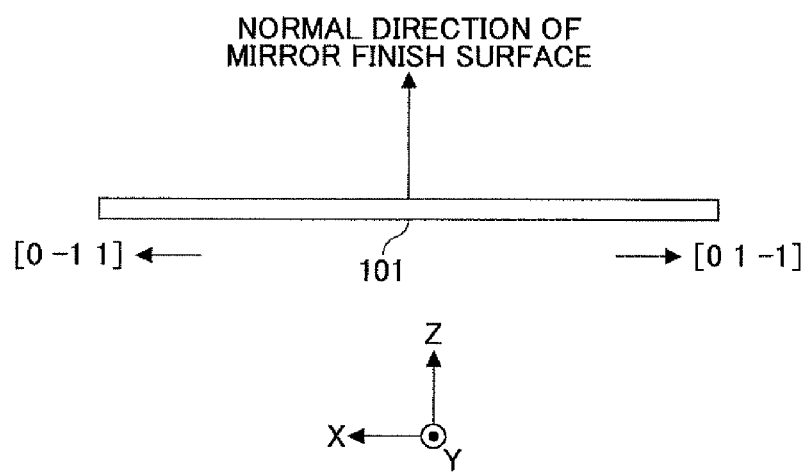

In this case, as illustrated in FIG. 23A, the substrate 101 may be an n-GaAs mono-crystal substrate, and the normal line direction of a mirror finished surface (main surface) of the substrate 101 is slanted at 15 degrees ($\theta=15$) toward a crystal orientation [1 1 1]A direction from a crystal orientation [1 0 0] direction. That is, the substrate 101 may be a slanted substrate. As illustrated in FIG. 23B, the substrate 101 may be arranged such that the crystal orientation [0 −1 1] direction of the substrate 101 is a +X direction and the crystal orientation [0 1 −1] direction of the substrate 101 is a −X direction.

If a slanted substrate is used as the substrate 101, a polarization direction may be stabilized to make a polarization mode suppression ratio PMSR high. Note that the polarization mode suppression ratio PMSR is a ratio of light intensity of a desired polarization direction of laser light to light intensity of a direction perpendicular to the desired polarization direction of laser light.

For example, in a surface-emitting laser element that has a configuration similar to that of the surface-emitting laser element 100 according to the embodiment but has no mode filter, laser light has become susceptible to being polarized in a direction perpendicular to the slanted direction of the substrate 101 (i.e., the X-axis direction in FIG. 23A) mainly due to the effect of the slanted substrate 101 and the effect of deformation of the active layer. With this configuration, the obtained polarization mode suppression ratio PMSR is in a range of 20 to 30 dB.

Further, in the surface-emitting laser element 100 according to the embodiment having a circular mode filter, laser light has become susceptible to being polarized in a direction of the slanted substrate (i.e., the Y-axis direction in FIG. 23A). With this configuration, the obtained polarization mode suppression ratio PMSR is decreased in a range of 10 to 20 dB.

Further, if the surface-emitting laser element 100 according to the embodiment includes a mode filter 115 illustrated in FIG. 22, laser light has become susceptible to being polarized in a direction perpendicular to the slanted direction of the substrate (i.e., the Y-axis direction in FIG. 23A). With this configuration, the obtained polarization mode suppression ratio PMSR is in a range of 20 to 30 dB. That is, in the surface-emitting laser element 100 according to the embodiment having a circular mode filter, the obtained polarization mode suppression ratio PMSR is improved compared to that obtained with the mode filter having a symmetrical (non-anisotropic) shape. Note that in this case (see FIG. 22), the dielectric film is partially removed in a region that encloses the central portion of the emission region; however, the basic mode output of the laser beam is approximately the same as that of the surface-emitting laser element 100 according to the embodiment. Thus, the surface-emitting laser element capable of outputting the high power basic transverse mode laser beam, having low element resistance and a high polarization mode suppression ratio PMSR may be obtained.

One of the factors that may have improved polarization stability by dividing a region into plural sub-regions where the dielectric film having an optical thickness of λ/4 is formed may be the anisotropy generated in an optical confinement effect in two orthogonal directions. In the example where the surface-emitting laser element is provided with the mode filter 115 illustrated in FIG. 22, light having a polarization direction perpendicular to the slanted direction of the substrate (i.e., the X-axis direction in FIG. 23A) exhibits an optical confinement effect in the central portion having a reflectance higher than that of the peripheral portion within the emission region, and has an oscillation value lower than that of light having a polarization direction congruent with the slanted direction of the substrate. As a result, the polarization mode suppression ratio PMSR may be improved.

That is, in the example of FIG. 22, plural mode filters are provided to generate shape anisotropy in a region sandwiched between the plural mode filters having respective different shapes, which may induce anisotropy in the optical confinement effect in a transverse direction. Accordingly, the polarization component in a direction having a high optical confinement effect is more easily oscillated than that in the polarization component in a direction having a low optical confinement effect, so that the polarization direction may be made congruent in the direction having the high optical confinement effect.

Note that if a desired polarization direction is defined as the slanted direction of the substrate (i.e., the Y-axis direction in FIG. 23A), the mode filter 115 may be provided in two mutually facing sub-regions that sandwich the central portion of the emission region in an X-axis direction and that are located outside the central portion of the emission region.

Note that if the surface-emitting laser element is not provided with the mode filter, the stable polarization direction may be changed by altering the deformation of the active layer or the like.

In the example illustrated in FIG. 22, the two sub-regions are symmetrically arranged based on the axis passing through the center of the emission region and in parallel with the Y-axis. However, the arrangements of the two sub-regions (e.g., first and second sub-regions) may not be limited to such arrangements. The first sub-region may be arranged on one side of the axis passing through the center of the emission region and in parallel with the Y-axis and the second sub-region may be arranged on the other side of the axis passing through the center of the emission region and in parallel with the Y-axis.

Further, in the example in FIG. 22, the sub-regions have halved doughnut shapes; however, the shape of the sub-region may not be limited to the halved doughnut shape. The sub-region may be any desired shape such as a rectangular shape (see FIG. 24), a semicircular shape, or an oval shape.

The dielectric films formed in the two sub-regions may be made of the same material or different materials.

Further, the mode filter 115 may be provided outside of the central portion of the emission region, and the mode filter 115 may be formed in a sub-region having a shape such as an oval shape that exhibits shape anisotropy generated in a desired polarization direction and a direction perpendicular to the desired polarization direction (i.e., shape anisotropy in two orthogonal directions). Alternatively, the mode filter 115 may exhibit shape anisotropy generated by different widths of the mode filter 115.

In a case where the mode filter 115 formed on the slanted substrate is used, the normal direction of the main surface of the substrate may be slanted toward one direction of the crystal orientation [1 1 1] from another direction of the crystal orientation [1 0 0] (see FIG. 23A).

Figure 24:
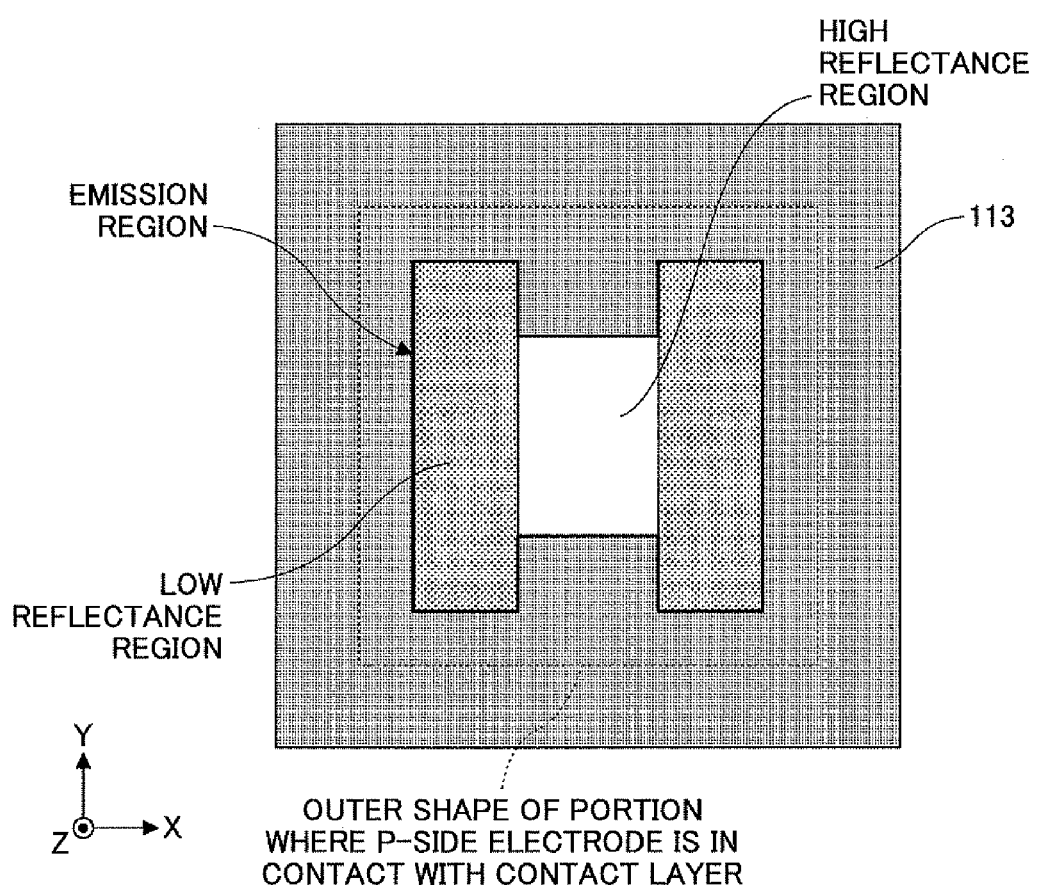
FIG. 24 is a diagram illustrating a second modification of the mode filter.
Figure 25:
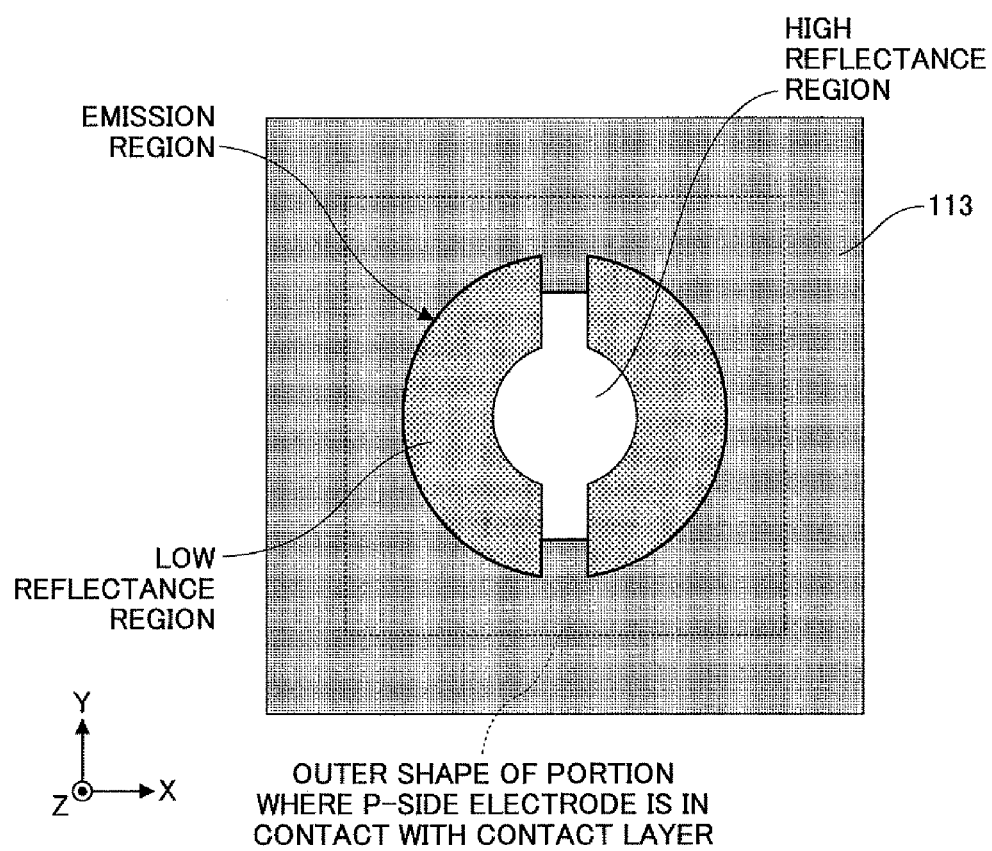
FIG. 25 is a diagram illustrating a modification of the p-side electrode.

For example, as illustrated in FIGS. 24 and 25, two mode filters 115 are formed in corresponding two mutually facing sub-regions that sandwich the central portion of the emission region in an X-axis direction and that are located outside the central portion of the emission region, and a region sandwiched by the two sub-regions may include a part of a contact region where the p-side electrode 113 is in contact with the contact layer 109. In these examples, the dimensions of the contact region where the p-side electrode 113 is in contact with the contact layer 109 may be increased and the element resistance may further be reduced. Note that with the above configuration, the p-side electrode 113 may overlap part of the mode filters 115.

Further, in the above embodiment, the optical thickness of the mode filters 115 is λ/4; however, the optical thickness of the mode filters 115 is not limited to λ/4. That is, the optical thickness of the mode filters 115 is λ/4; however, the optical thickness of the mode filters 115 may be any odd multiple of λ/4.

Figure 26:
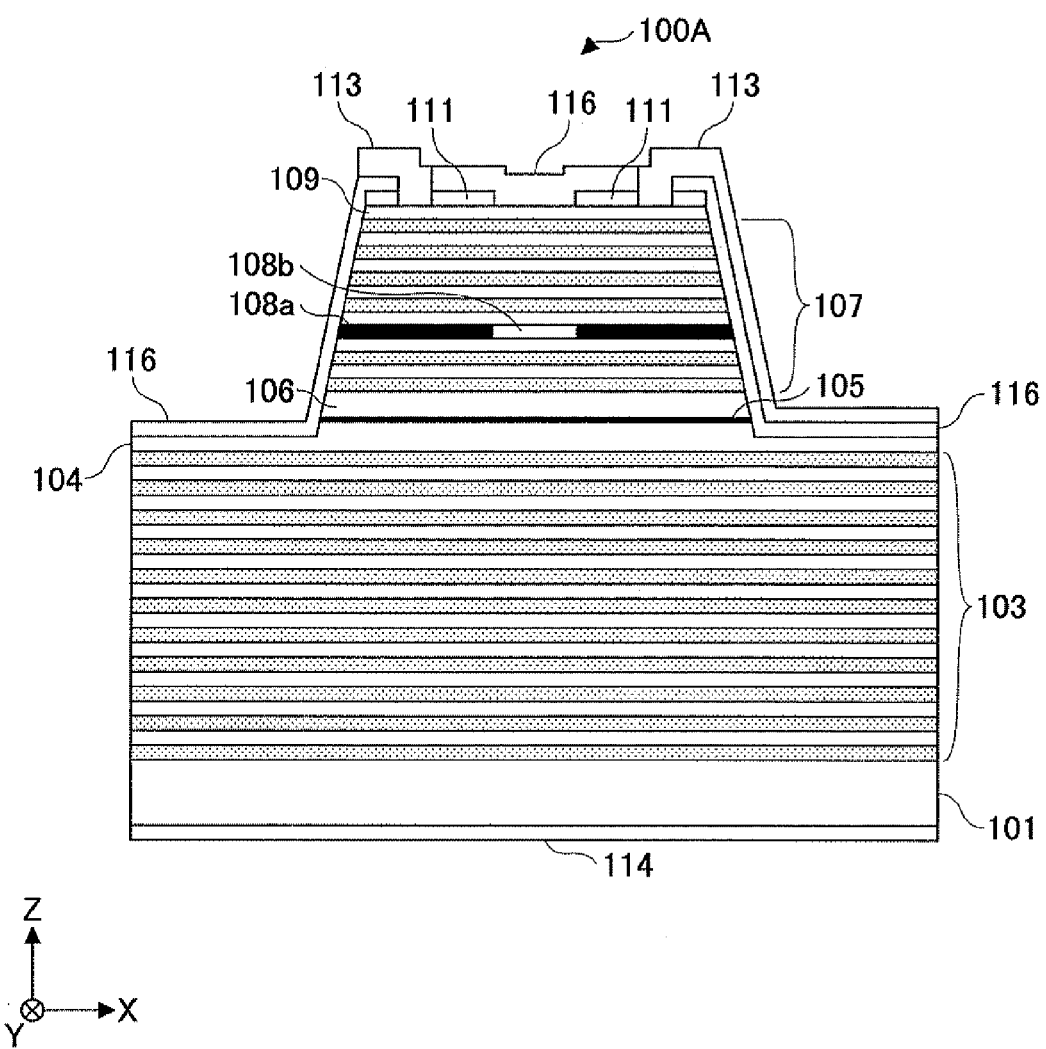
FIG. 26 is a first example diagram illustrating a first modification of the surface-emitting laser element according to the embodiment illustrated in FIG. 3.
Figure 27:
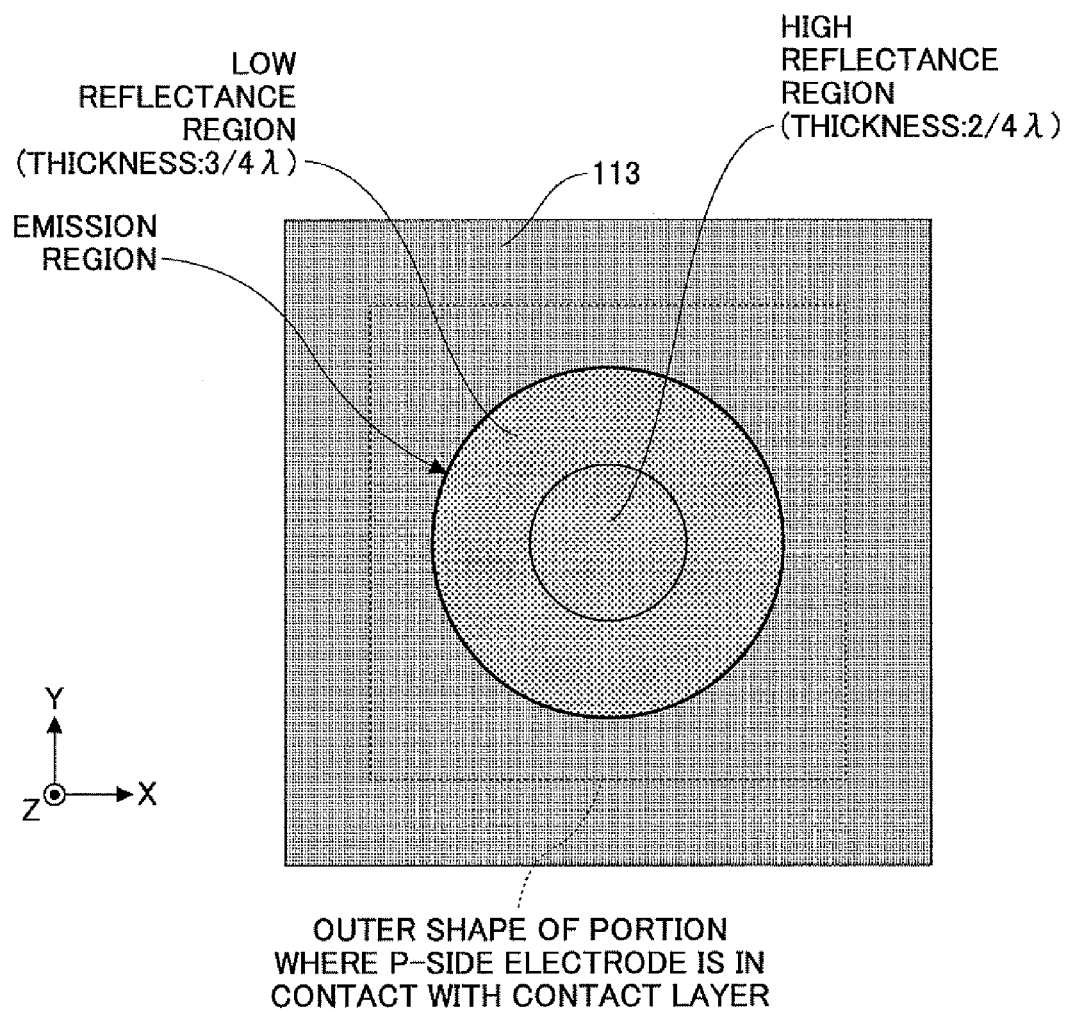
FIG. 27 is a second example diagram illustrating the first modification of the surface-emitting laser element according to the embodiment illustrated in FIG. 3.

Further, as illustrated in FIGS. 26 and 27, a surface-emitting laser element 100A may be employed in place of the surface-emitting laser element 100 according to the above embodiment. The surface-emitting laser element 100A is obtained by forming a dielectric film 116 (i.e., second dielectric film) made of SiN and having an optical thickness of $2\lambda/4$ over an entire emission region of the surface-emitting laser element 100. Since a refractive index n of SiN is 1.86 and an oscillation wavelength $\lambda$ of SiN is 780 nm, the actual film thickness ($=2\lambda/4$ n) of the dielectric film 116 is determined as approximately 210 nm.

In this case, the central portion of the emission region is coated with the dielectric film 116 made of SiN and having the optical thickness of $2\lambda/4$. Further, the mode filter is formed of the dielectric film (protection layer) 111 made of SiN and having the optical thickness of $\lambda/4$ and the dielectric film 116 made of SiN and having the optical thickness of $2\lambda/4$ (see FIGS. 26 and 27). That is, the mode filter is formed of a dielectric film made of SiN and having an optical thickness of $3\lambda/4$.

In this example, since the entire emission region is coated with the dielectric film 116, the oxidation or contamination of the emission region may be suppressed. Note that the central portion of the emission region is coated with the dielectric film 116. However, since the optical thickness is an even multiple of the $\lambda/2$, the reflectance may not be lowered. Thus, optical properties similar to those without the dielectric film 116 may be obtained.

That is, if the optical thickness of the portion preferably having a low reflectance is an odd multiple of $\lambda/4$ and the optical thickness of the portion other than that having the low reflectance is an even multiple of $\lambda/4$, the effect similar to that obtained in the surface-emitting laser element 100 may be obtained.

Figure 28:
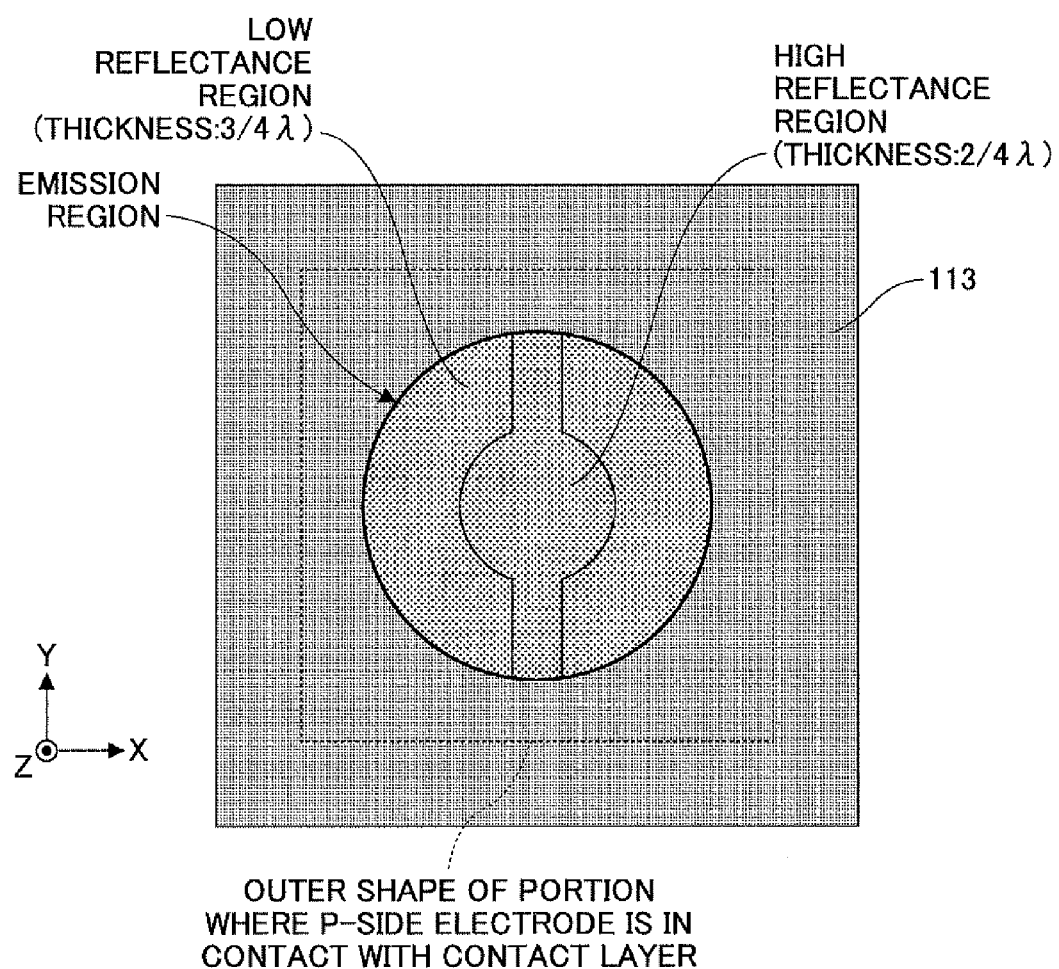
FIG. 28 is a diagram illustrating a modification of the mode filter utilized in the first modification of the surface-emitting laser element.

Note that, as illustrated in FIG. 28, the mode filter may be provided in two mutually facing sub-regions that sandwich the central portion of the emission region in an X-axis direction and that are located outside the central portion of the emission region. In addition, the substrate 101 may be a slanted substrate.

Figure 29:
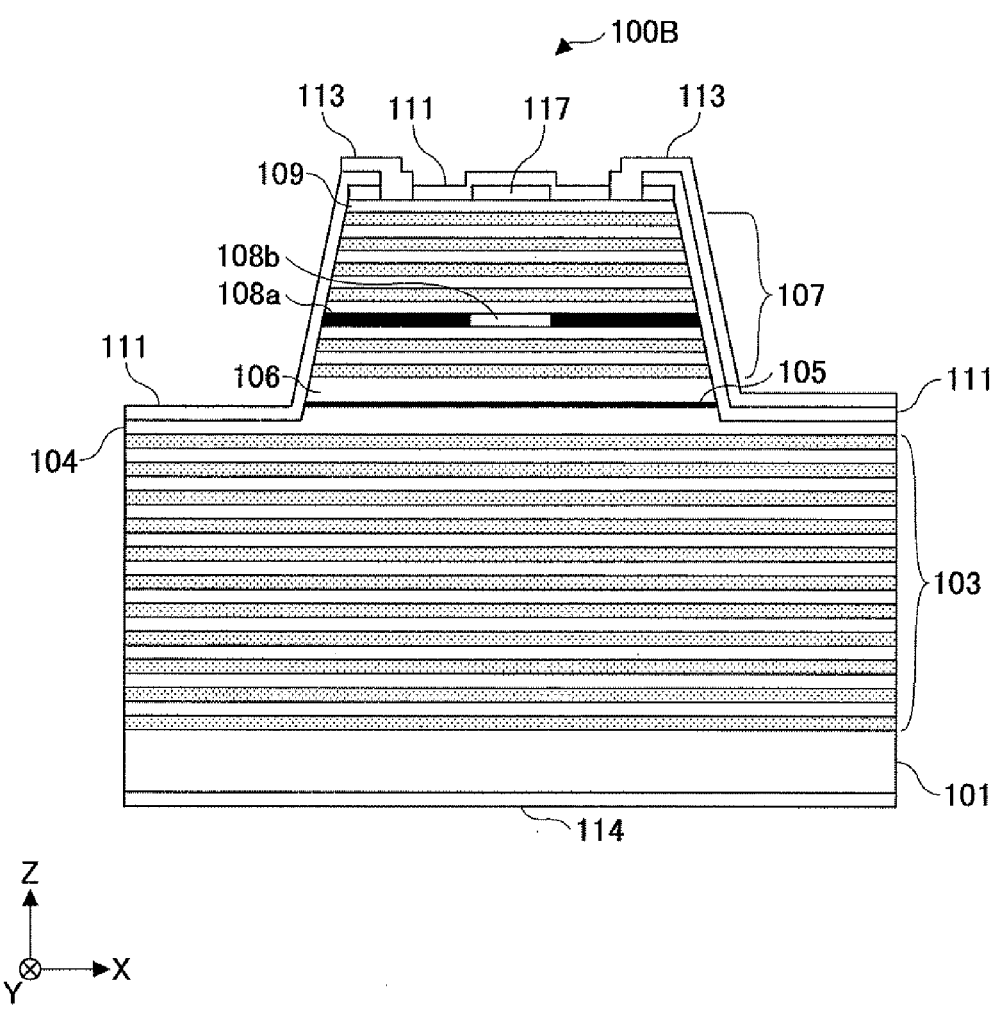
FIG. 29 is a first example diagram illustrating a second modification of the surface-emitting laser element according to the embodiment illustrated in FIG. 3.
Figure 30:
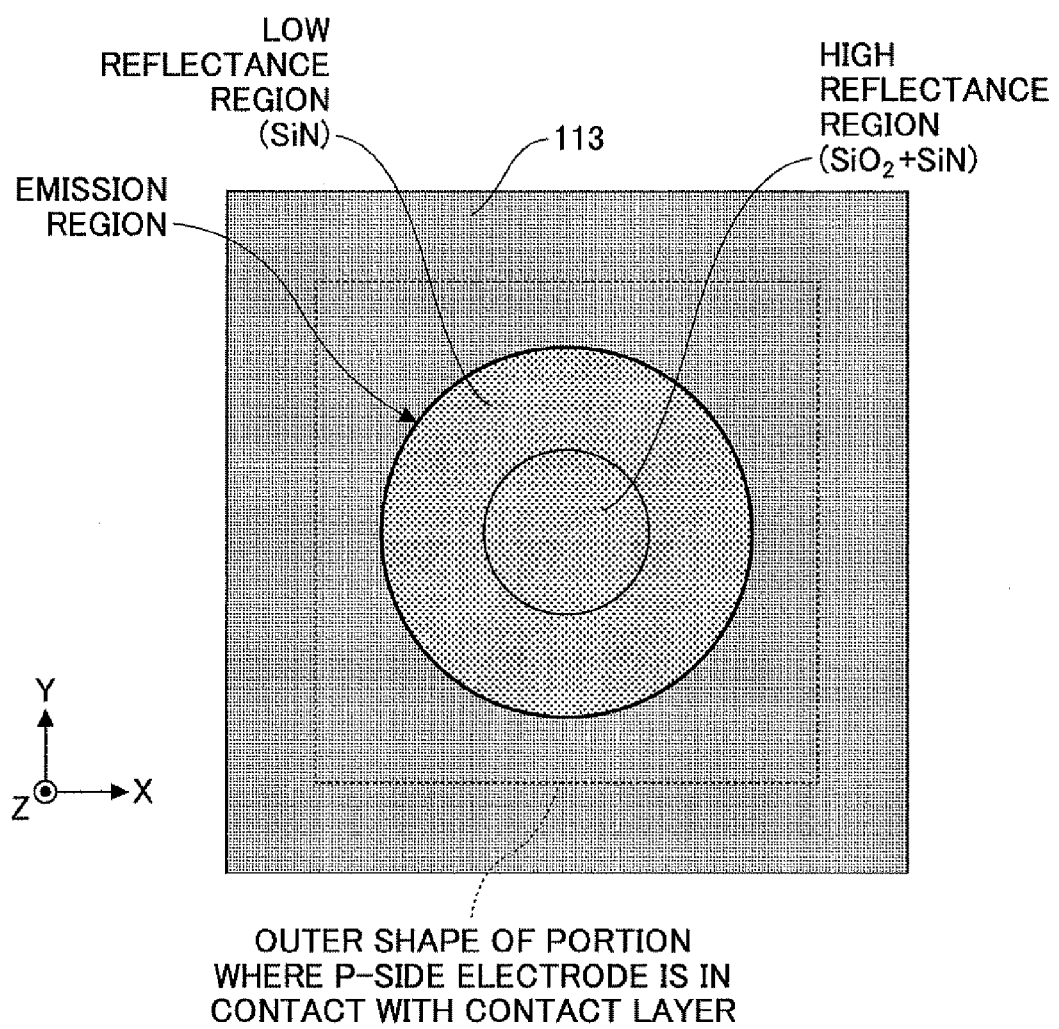
FIG. 30 is a second example diagram illustrating the second modification of the surface-emitting laser element according to the embodiment illustrated in FIG. 3.

Further, as illustrated in FIGS. 29 and 30, a surface-emitting laser element 100B may be employed in place of the surface-emitting laser element 100 according to the above embodiment. The surface-emitting laser element 100B is obtained by forming a high reflectance region formed of a two-layer transparent dielectric layer in the central portion of the emission region and a low reflectance region formed of a one-layer dielectric layer around the central portion, that is, in the peripheral portion within the emission region. The thicknesses of the corresponding dielectric layers formed in the central portion and the peripheral portion of the emission region are respective odd multiples of $\lambda/4$n (n is a corresponding refractive index based on the oscillation wavelength) based on the oscillation wavelength $\lambda$.

In the central portion of the emission region, two types of dielectric materials, namely, a $SiO_2$ layer and a SiN layer are layered on the contact layer 109 in this order from a lower side to an upper side of the contact layer 109. In this example, it is preferable that a refractive index of a lower dielectric layer 117 be lower than a refractive index of an upper dielectric layer 111. Specifically, although film thicknesses may vary with deposition conditions, the refractive index of the lower dielectric layer 117 made of $SiO_2$ is approximately 1.5 whereas the refractive index of the upper dielectric layer 111 made of SiN is approximately 1.86.

Only the SiN layer is formed in a peripheral region around the central portion of the emission region (or peripheral portion within the emission region).

With such a dielectric layer thickness configuration, the central portion has a configuration similar to that of an ordinary multilayer mirror so that the reflectance of the central portion of the emission region is high. On the other hand, in the peripheral region around the central portion (i.e., the peripheral portion within the emission region), the dielectric layer having the thickness of $\lambda/4$n is formed on the semiconductor multilayer mirror. Accordingly, since the refractive index of SiN is lower than that of the semiconductor multilayer mirror, the reflectance of the peripheral region around the central portion of the emission region is lowered.

Further, in the surface-emitting element 100B, since the reflectance of the central portion of the emission region is improved (increased), the difference between the reflectance of the central portion and that of the peripheral region around (outside) the central portion of the emission region may be significantly increased.

Figure 31:
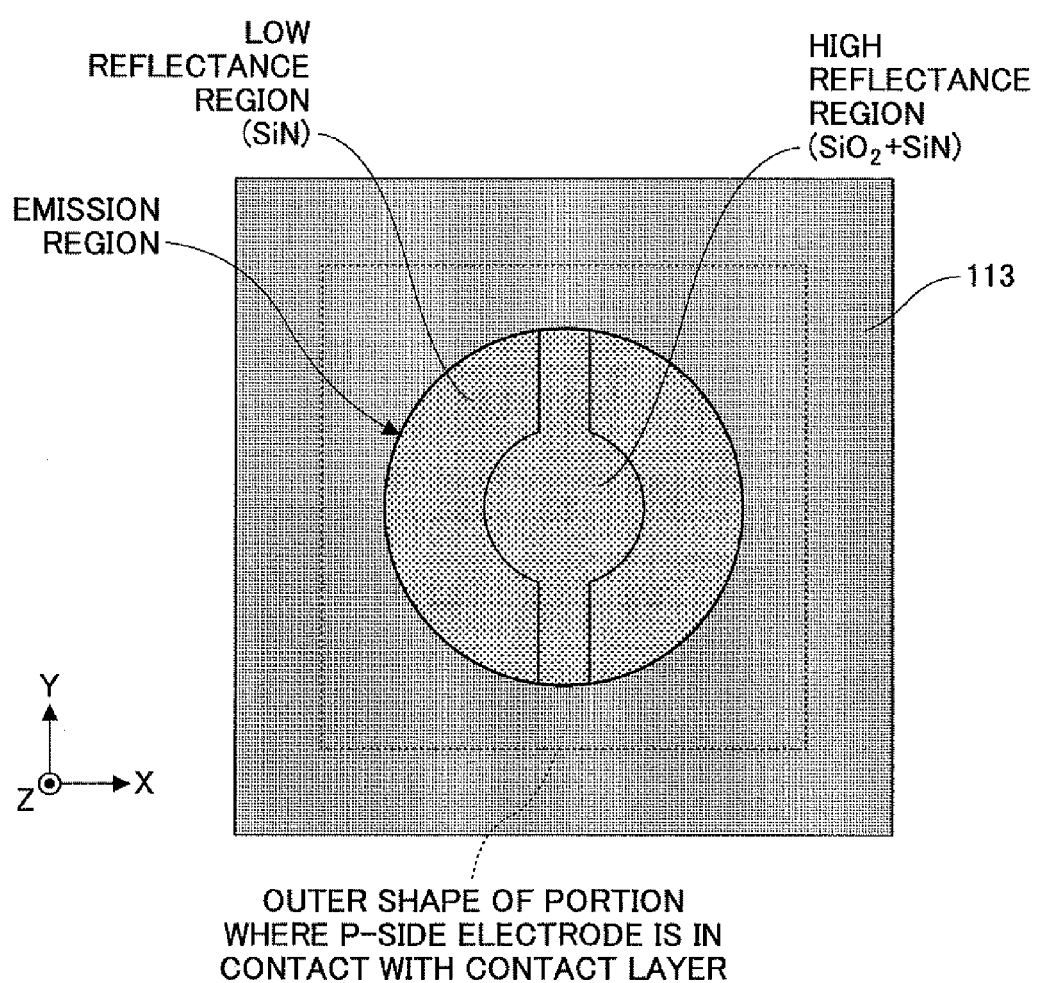
FIG. 31 is a diagram illustrating a modification of the mode filter utilized in the second modification of the surface-emitting laser element.

Note that, as illustrated in FIG. 31, the mode filter may be provided in two mutually facing sub-regions that sandwich the central portion of the emission region in an X-axis direction and that are located outside the central portion of the emission region. In addition, the substrate 101 may be a slanted substrate.

Figure 32:
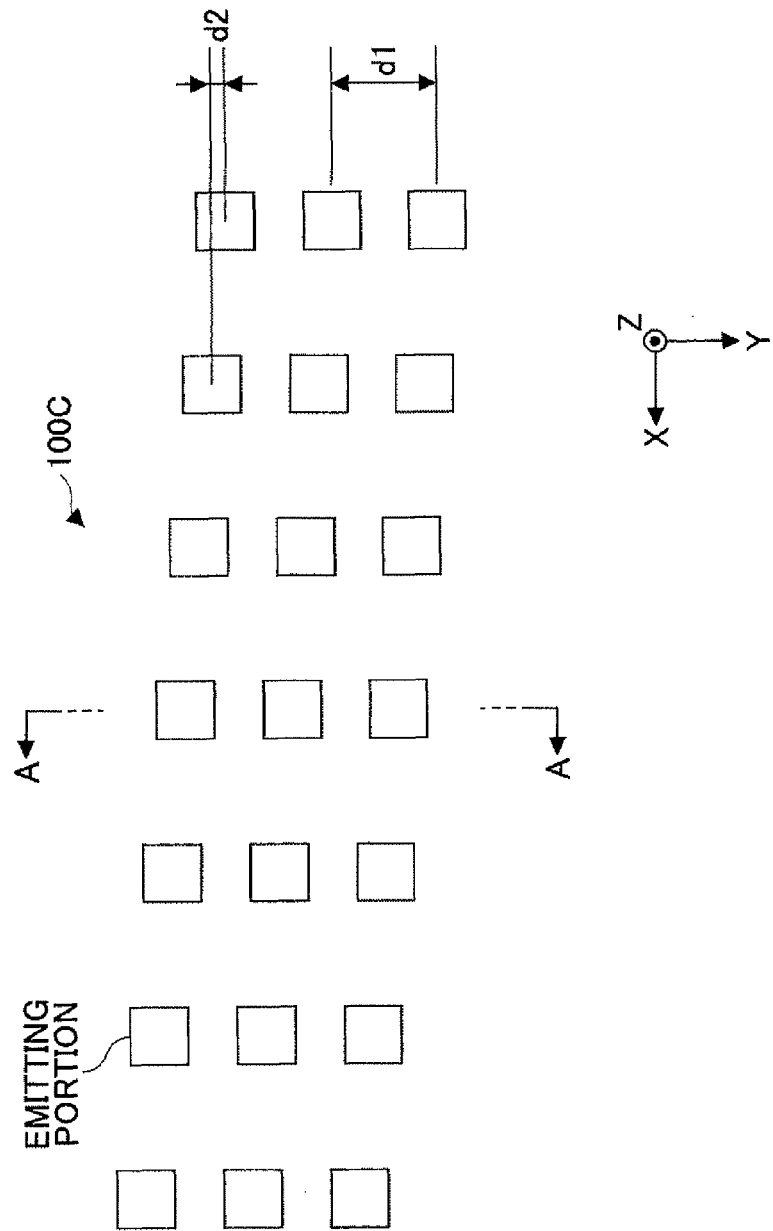
FIG. 32 is a diagram illustrating a surface-emitting laser array.

Further, in the above embodiment, the light source 14 may include a surface-emitting laser array 100C illustrated in FIG. 32 in place of the surface-emitting laser element 100 according to the above embodiment.

The surface-emitting laser array 100C includes plural (21 in this case) light-emitting portions arranged on the same substrate. In FIG. 32, the X-axis direction is a main-scanning corresponding direction, and the Y-axis direction is a sub-scanning corresponding direction. The emitting portions are adjacently arranged such that the adjacent emitting portions have equal intervals d2 when all the emitting portions are orthogonally projected in a virtual line in the Y-axis direction. That is, 21 light-emitting portions are two-dimensionally aligned. Note that in this specification, "light-emitting portion interval" is a center-to-center distance between the adjacent light-emitting portions. Note also that the number of light-emitting portions is not limited to 21.

Figure 33:
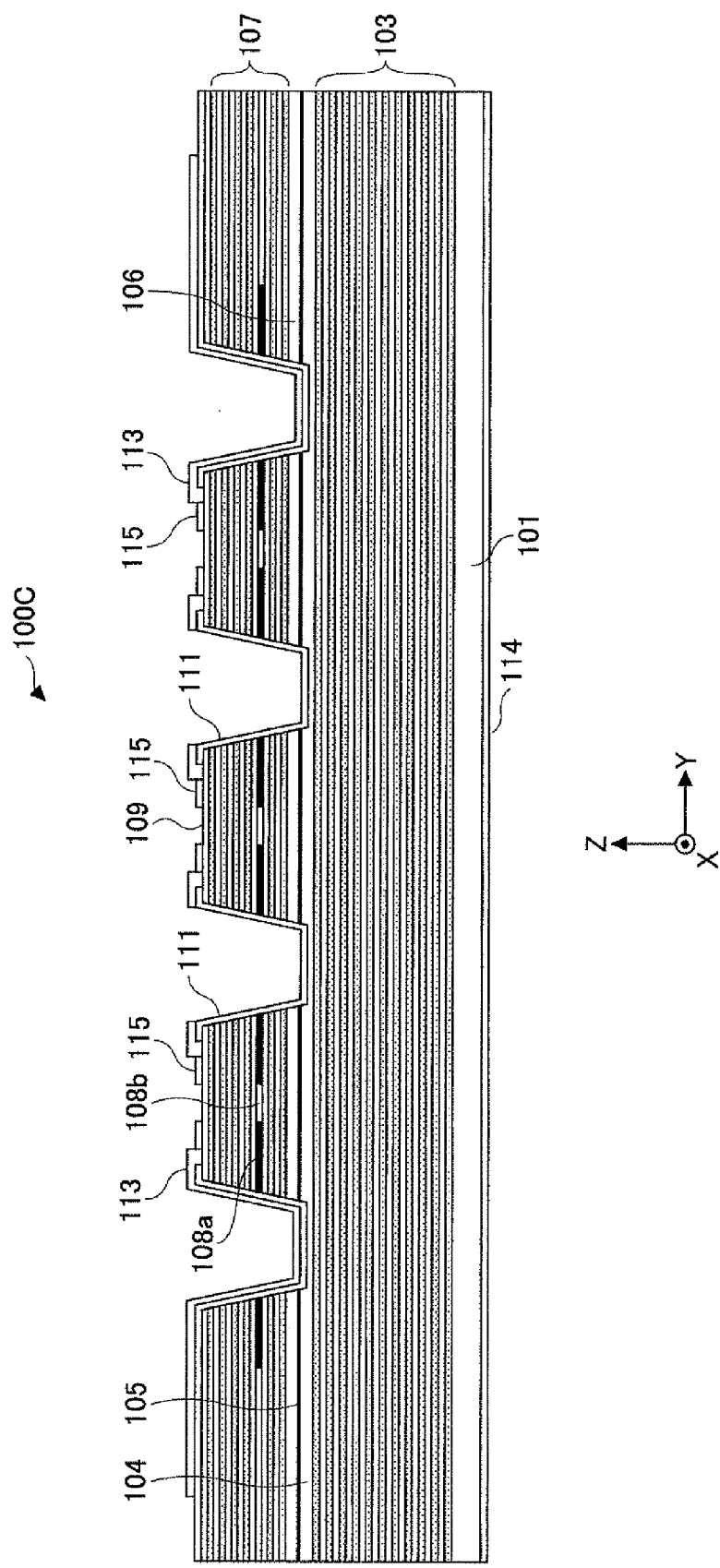
FIG. 33 is a cross-sectional diagram of the surface-emitting laser array illustrated in FIG. 32 cut along a line A-A.

As illustrated in FIG. 33 of an A-A sectional diagram of FIG. 32, each light-emitting portion of the surface-emitting laser array 100C has a structure similar to that of the above surface-emitting laser element 100. In addition, the surface-emitting laser array 100C may be fabricated in the same manner as the fabrication method of the above surface-emitting laser element 100. Thus, plural high power single mode laser beams having uniform polarization directions between the light-emitting portions may be obtained. Accordingly, 21 densely arranged round minute optical spots may be simultaneously formed on the photoreceptor drum 1030.

In the surface-emitting laser array 100C, since the emitting portions are arranged at equal light-emitting portion intervals d2 when all the emitting portions are orthogonally projected in a virtual line extended in the sub-scanning direction, the photoreceptor drum 1030 may be treated as a photoreceptor drum having the emitting portions arranged at equal light-emitting portion intervals d2 on its surface in the sub-scanning direction by controlling emitting timing of the laser beams. Note that as illustrated in FIG. 32, in the surface-emitting laser array 100C, a top view of each light-emitting portion or element (mesa) has a square outer shape, and the square light-emitting portions or elements are physically and two-dimensionally arranged adjacent to one another such that adjacent sides between the adjacent elements are in parallel with one another. With this configuration, if the light-emitting portion intervals d2 of the square light-emitting portions (elements) are the same as those for the round light-emitting elements (mesa), the mesa area of the square light-emitting portion (element) in the top view may be increased. As a result, an electrode contact area for each square light-emitting portion (element) may be increased. If dimensions of the electrode contact of the square element (mesa) area are set at the same dimensions as those of the round element (mesa), a pitch d1 between the square elements (the same as light-emitting interval in this case) may be reduced.

If the above light-emitting portion interval d2 is 2.65 µm, and the magnification of the optical scanner device 1010 is doubled (2×), the optical scanner device 1010 may scan an image with high-density resolution of 4800 dpi. Further, if the number of the light-emitting portions is increased, the light-emitting portions are arranged in an array configuration where the light-emitting portion interval d2 is reduced by narrowing a pitch d1 in the sub-scanning direction, or the magnification of the optical system is reduced, the optical scanner device 1010 may scan an image with even higher-density resolution, thereby printing the image with high quality. With this configuration, since the surface-emitting laser array 100C incorporates plural surface-emitting laser elements while narrowing the light-emitting portion intervals d2, the surface-emitting laser elements may be densely integrated to form the surface-emitting laser array 100C capable of lowering the element resistance while operating in a high power single transverse mode. Note that the writing intervals in the main-scanning direction may be easily controlled by adjusting timing of the light-emitting portions.

In this case, the laser printer 1000 may print the image without lowering printing speeds despite the fact that writing dot density is increased. Further, the laser printer 1000 may print the image with higher printing speeds when the writing dot density is constant. Moreover, since the surface-emitting laser element according to the embodiment outputs a high power single mode laser beam, the laser printer 1000 may be capable of carrying out high speed printing and producing high-definition images.

Further, the polarization directions of the flux emitted from the light-emitting portions are stably aligned, so that the laser printer 1000 may stably form high quality images.

Figure 34:
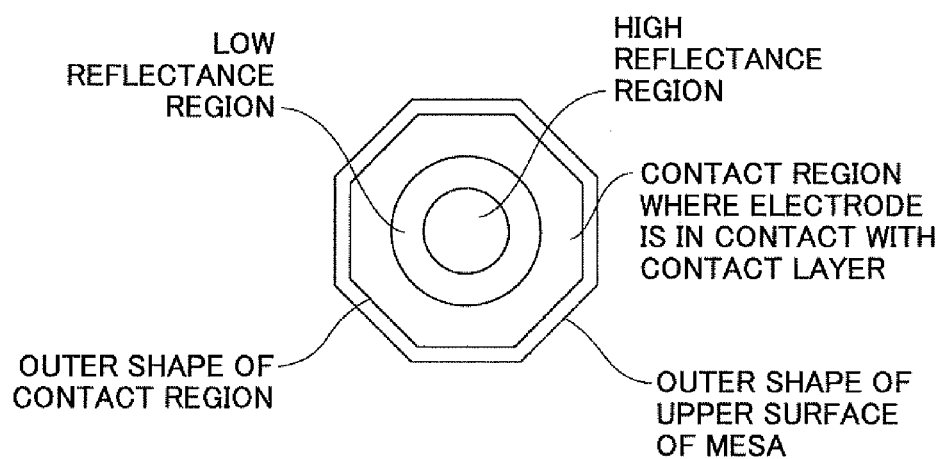
FIG. 34 is a diagram illustrating a surface-emitting laser element when an outer shape of the surface-emitting laser element is an octagon shape.
Figure 35:
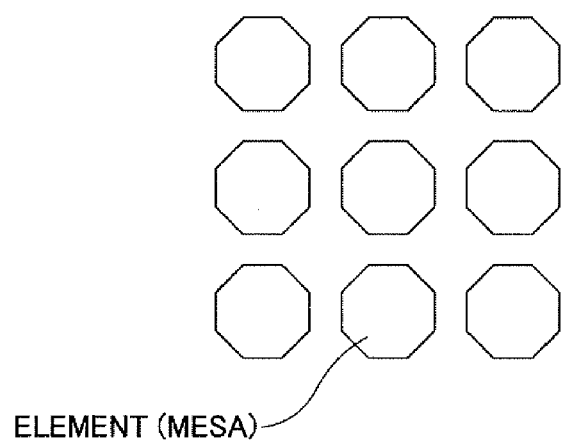
FIG. 35 is a diagram illustrating a surface-emitting laser array when the surface-emitting laser elements having the octagon outer shape illustrated in FIG. 34 are arranged 3 by 3 in a two-dimensional arrangement.

The surface-emitting laser array C may alternatively include light-emitting elements each having an outer shape of octagon illustrated in FIG. 34 arranged two-dimensionally. FIG. 35 illustrates an example of the surface-emitting laser array where the octagon light-emitting elements are arranged 3 by 3. In this surface-emitting laser array, the octagon light-emitting elements are two-dimensionally arranged such that their facing sides between the adjacent octagon light-emitting elements are in parallel with one another. In the octagon light-emitting element, the contact area may not be increased so much compared to the square light-emitting element; however, the contact area may be increased compared to the related art round light-emitting element.

Further, the surface-emitting laser array 100C may include light-emitting portions similar to the surface-emitting laser elements 100 but arranged one dimensionally, in place of the surface-emitting laser elements 100.

In the above embodiment, the oscillation wavelength of each of the light-emitting portions is 780 nm; however, the oscillation wavelength of the light-emitting portions is not limited to 780 nm. The oscillation wavelength of the light-emitting portions may be changed based on characteristics of the photoreceptor drum.

Further, the surface-emitting laser element may be used for other apparatuses or devices other than the image forming apparatus. In such cases, the oscillation wavelength may be 650 nm, 850 nm, 980 nm, 1.3 µm, or 1.5 µm based on application purposes. In this case, a mixed crystal semiconductor material is used for the active layer formed of the semiconductor material. For example, if the oscillation wavelength is 650 nm, AlGaInP series mixed crystal semiconductor material is used. If the oscillation wavelength is 980 nm, InGaAs series mixed crystal semiconductor material is used. If the oscillation wavelength is 1.3 µm or 1.5 µm, InNAs(Sb) series mixed crystal semiconductor material is used.

Further, the oscillation wavelength is selected based on a material of the reflecting mirror and a configuration of the reflecting mirror. Accordingly, an emission portion having a desired oscillation wavelength may be formed. For example, the emission portion may be formed of a mixed crystal semiconductor material, such as AlGaInP mixed crystal semiconductor material, other than AlGaAs mixed crystal semiconductor material. Note that a preferable combination of the low refractive index layer and the high refractive index layer may be those transparent for the oscillation wavelength and that have the greatest difference in the refractive index between the low refractive index layer and the high refractive index layer.

Note that the above embodiment has described a case where the optical scanner device 1010 is utilized for a printer; however, the optical scanner device 1010 may also be utilized for apparatuses other than the printer such as a copier, a facsimile machine, and a multiple functional apparatus incorporating these apparatuses.

Further, in the above embodiment, the laser printer 1000 is used as the image forming apparatus; however, the image forming apparatus is not limited to the laser printer 1000.

For example, an image forming apparatus may be configured to directly emit a laser beam toward a color-producing medium (e.g., paper).

Or an image forming apparatus may be configured to include a silver film as an image carrying member. In this case, a latent image is formed on the silver film by optical scanning, and the latent image is visualized by a process similar to a developing process of an ordinary silver halide photography process. Subsequently, the visualized image is transferred onto photographic printing paper by a printing process similar to that carried out in the ordinary silver halide photography process. The image forming apparatus described above may be implemented as an optical plate-making apparatus or an optical plotting apparatus plotting CT scanned images.

Figure 36:
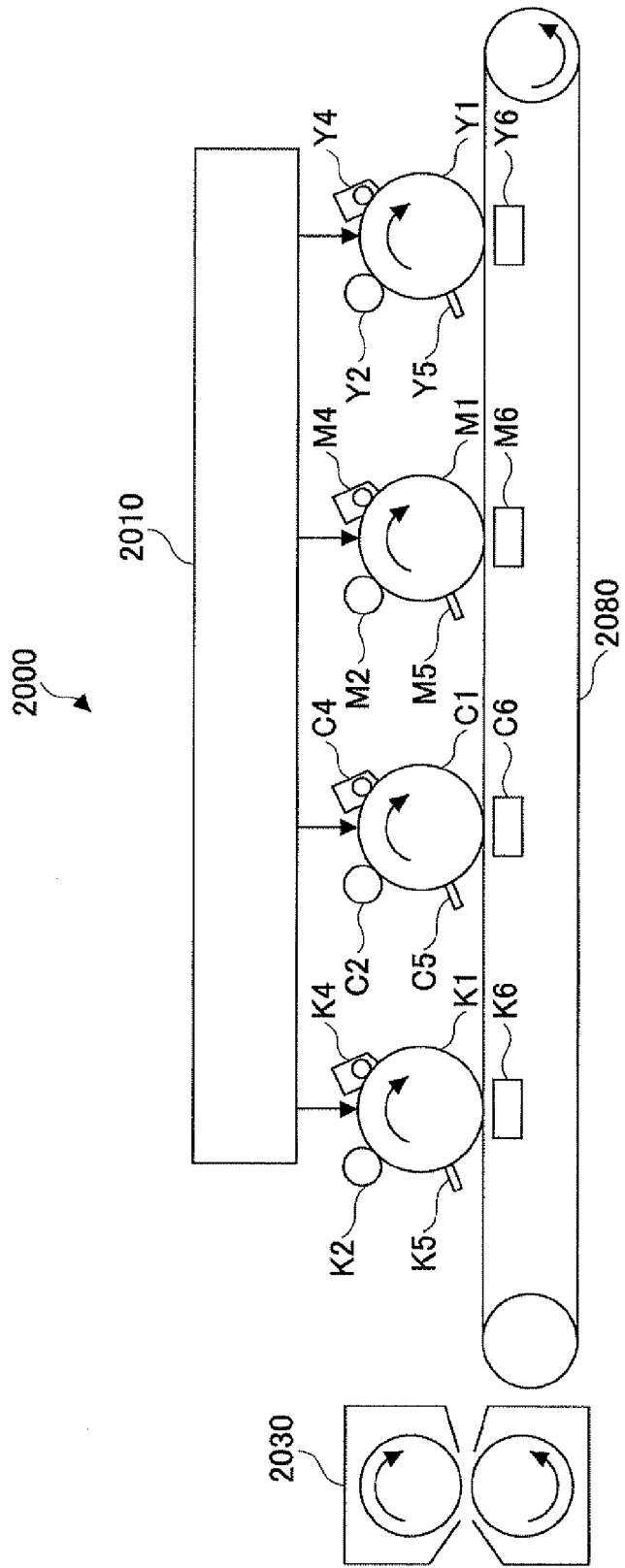
FIG. 36 is a schematic diagram illustrating a color printer.

In addition, the image forming apparatus described above may be a color printer 2000 having plural photoreceptor drums as illustrated in FIG. 36.

The color printer 2000 is a tandem type multi-color printer that forms a full-color image by superposing four colors (black, cyan, magenta, and yellow). The color printer 2000 includes a black set of "a photoreceptor drum K1, a charging device K2, a developing device K4, a cleaning unit K5, and a transfer device K6"; a cyan set of "a photoreceptor drum C1, a charging device C2, a developing device C4, a cleaning unit C5, and a transfer device C6"; a magenta set of "a photoreceptor drum M1, a charging device M2, a developing device M4, a cleaning unit M5, and a transfer device M6"; and a yellow set of "a photoreceptor drum Y1, a charging device Y2, a developing device Y4, a cleaning unit Y5, a transfer device Y6"; an optical scanner device 2010; a transfer belt 2080; and a fixing unit 2030.

As illustrated in FIG. 36, the photoreceptor drums K1, C1, M1, and Y1 are rotated as indicated by respective arrows, and the charging devices K2, C2, M2, and Y2, the developing devices K4, C4, M4, and Y4, the cleaning devices K5, C5, M5, and Y5, and the transfer devices K6, C6, M6, and Y6 are arranged in the peripheries of the respective photoreceptor drums K1, C1, M1, and Y1 along respective rotational directions. The charging devices K2, C2, M2, and Y2 are configured to uniformly charge respective surfaces of the photoreceptor drums K1, C1, M1, and Y1. The respective surfaces of the photoreceptor drums K1, C1, M1, and Y1 are charged by the charging devices K2, C2, M2, and Y2, and the charged surfaces of the photoreceptor drums K1, C1, M1, and Y1 are irradiated with light emitted from the optical scanner device 2010; thereby respective latent images are formed on the photoreceptor drums K1, C1, M1, and Y1. Subsequently, toner images of respective colors are formed on the photoreceptor drums K1, C1, M1, and Y1 by the developing devices K4, C4, M4, and Y4. Thereafter, the toner images of respective colors on the photoreceptor drums K1, C1, M1, and Y1 are transferred by the transfer devices K6, C6, M6, and Y6 onto recording paper on the transfer belt 2080, and a full color image is finally fixed on the recording paper by the fixing unit 2030.

The optical scanner device 2010 includes a light source for each color. The light source for each color may include a surface-emitting laser element similar to the surface-emitting laser element 100, the surface-emitting laser element 100A, the surface-emitting laser element 100B, or a surface-emitting laser array similar to the surface-emitting laser array 100C. With this configuration, the optical scanner device 2010 may exhibit effects similar to those obtained by the optical scanner device 1010. Further, since the color printer 2000 includes the optical scanner device 2010, the color printer 2000 may exhibit effects similar to those obtained by the laser printer 1000.

Note that in the color printer 2000, color misalignment may occur due to a fabrication error or a locating error of components. However, if the optical scanner device 2010 includes the light sources for respective colors each having the surface-emitting laser array similar to the surface-emitting laser array 100C, the color misalignment may be controlled by selecting appropriate light-emitting portions to emit laser beams.

As described above, in one embodiment, there is provided a surface-emitting laser element that includes: a resonator structure including an active layer; a first semiconductor multilayer mirror and a second semiconductor multilayer mirror configured to sandwich the resonator structure including the active layer; an electrode provided around an emission region of a light-emitting surface; and a first dielectric film provided in a peripheral portion within the emission region and outside a central portion of the emission region to make a reflectance of the peripheral portion lower than a reflectance of the central portion. An outer shape of a portion where the electrode provided around the emission region of the light-emitting surface is in contact with a contact layer includes corners.

With this configuration, the surface-emitting laser element is capable of lowering electric resistance of the surface-emitting laser element while operating in a high power single transverse mode.

In another embodiment, there is provided a surface-emitting laser array having a plurality of the surface-emitting laser elements.

With this configuration, since the surface-emitting laser array incorporates the plurality of the surface-emitting laser elements without widening a pitch between the surface-emitting laser elements, the surface-emitting laser elements may be densely integrated to form the surface-emitting laser array capable of lowering electric resistance of the surface-emitting laser element while operating in a high power single transverse mode.

In another embodiment, there is provided an optical scanner device for optically scanning a scanning surface that includes: a light source including a surface-emitting laser element; a deflector configured to deflect light emitted from the light source; and a scanning optical system configured to converge the light deflected by the deflector onto the scanning surface.

With this configuration, since the optical scanner device includes the light source having the above surface-emitting laser element, optical scanning may be carried out with stability.

In another embodiment, there is provided an optical scanner device for optically scanning a scanning surface that includes: a light source including a surface-emitting laser array; a deflector configured to deflect light emitted from the light source; and a scanning optical system configured to converge the light deflected by the deflector onto the scanning surface.

With this configuration, since the optical scanner device includes the light source having the above surface-emitting laser array, optical scanning may be carried out with stability.

In another embodiment, there is provided an image forming apparatus that includes: at least one image carrying member; and at least one of the optical scanner device that includes the light source having a surface-emitting laser element and the optical scanning device that includes the light source having a surface-emitting laser array configured to scan light modulated based on image information on the image carrying member.

With this configuration, since the image forming apparatus includes the above optical scanner device, an image may be formed with high image quality.

As described above, the surface-emitting laser element and the surface-emitting laser array according to the above embodiments are capable of lowering the element resistance while operating in a high power single transverse mode. Further, the optical scanner device according to the embodiment is suitable for carrying out stable optical scanning. Moreover, the image forming apparatus according to the embodiment is suitable for forming a high quality image.

Embodiments of the present invention have been described for the purpose of illustration. The present invention is not limited to these embodiments, but various variations and modifications may be made without departing from the scope of the present invention. The present invention should not be interpreted as being limited to the embodiments that are described in the specification and illustrated in the drawings.

The present application is based on Japanese Priority Application No. 2009-269358 filed on Nov. 27, 2009, and Japanese Priority Application No. 2010-150759 filed on Jul. 1, 2010, with the Japanese Patent Office, the entire contents of which are hereby incorporated by reference.

What is claimed is:

1. A surface-emitting laser element comprising:
a resonator structure having an active layer;
a first semiconductor multilayer mirror and a second semiconductor multilayer mirror configured to sandwich the resonator structure having the active layer;
an electrode provided around an emission region of a light-emitting surface; and
a first dielectric film provided in a peripheral portion within the emission region and outside a central portion of the emission region to make a reflectance of the peripheral portion lower than a reflectance of the central portion,
wherein an external shape of the emission region corresponds to an internal shape of the electrode,
wherein the first dielectric film provided in the peripheral portion of the emission region has shape anisotropy in two orthogonal directions, and wherein when viewing from a laser oscillation direction, an outer shape of a portion where the electrode provided around the emission region of the light-emitting surface is in contact with a contact layer includes corners, and an inner shape of the portion where said electrode provided around the emission region of the light-emitting surface is in contact with the contact layer includes a curve.

2. The surface-emitting laser element as claimed in claim 1, wherein the emission region and the electrode are formed on a mesa structure, and a shape of the mesa structure, when viewed in the laser oscillation direction, includes corners.

3. The surface-emitting laser element as claimed in claim 2, wherein the outer shape of the portion where the electrode is in contact with the contact layer, when viewed in the laser oscillation direction, is a quadrangle shape.

4. The surface-emitting laser element as claimed in claim 3, wherein the emission region and the electrode are formed on the mesa structure, and an outermost circumferential shape of the mesa structure, when viewed in the laser oscillation direction, is a quadrangle shape.

5. The surface-emitting laser element as claimed in claim 1, wherein the first dielectric film is formed in plural sub-regions of the peripheral portion within the emission region and outside the central portion of the emission region.

6. The surface-emitting laser element as claimed in claim 5, wherein the sub-regions are arranged to be mutually facing such that the sub-regions sandwich the central portion of the emission region.

7. The surface-emitting laser element as claimed in claim 6, wherein a part of the portion where the electrode is provided in contact with the contact layer is located between the mutually facing sub-regions.

8. The surface-emitting laser element as claimed in claim 1, wherein the first dielectric film is arranged to enclose the central portion of the emission region.

9. The surface-emitting laser element as claimed in claim 1, wherein an optical thickness of the first dielectric film is an odd multiple of $\lambda/4$.

10. The surface-emitting laser element as claimed in claim 1, wherein the first dielectric film is made of any of SiNx, SiOx, TiOx, and SiON.

11. The surface-emitting laser element as claimed in claim 1, further comprising:
a second dielectric film coating the central portion of the emission region, wherein an optical thickness of the second dielectric film is an even multiple of $\lambda/4$.

12. The surface-emitting laser element as claimed in claim 11, wherein the second dielectric film coating the central portion of the emission region is made of a same material as a material of the first dielectric film provided in the peripheral portion within the emission region and outside the central portion of the emission region.

13. The surface-emitting laser element as claimed in claim 11, wherein the second dielectric film coating the central portion of the emission region includes a plurality of films having different refractive indexes.

14. The surface-emitting laser element as claimed in claim 13, wherein an optical thickness of each of the plurality of films having the different refractive indexes is an odd multiple of $\lambda/4$.

15. A surface-emitting laser array comprising a plurality of the surface-emitting laser elements as claimed in claim 1 integrated therein.

16. An optical scanner device optically scanning a scanning surface with light, the optical scanner device comprising:
a light source including the surface-emitting laser element as claimed in claim 1;
a deflector configured to deflect the light emitted from the light source; and
a scanning optical system configured to converge the light deflected by the deflector onto the scanning surface.

17. An optical scanner device optically scanning a scanning surface with light, the optical scanner device comprising:
a light source including the surface-emitting laser array as claimed in claim 15;
a deflector configured to deflect the light emitted from the light source; and
a scanning optical system configured to converge the light deflected by the deflector onto the scanning surface.

18. An image forming apparatus comprising:
at least one image carrying member; and
the optical scanner device as claimed in claim 16 configured to scan light modulated based on image information on the image carrying member.

19. The image forming apparatus as claimed in claim 18, wherein the image information is multicolored image information.

20. A surface-emitting laser element comprising:
a resonator structure having an active layer;
a first semiconductor multilayer mirror and a second semiconductor multilayer mirror configured to sandwich the resonator structure having the active layer;
an electrode provided around an emission region of a light-emitting surface; and
a first dielectric film provided in a peripheral portion within the emission region and outside a central portion of the emission region to make a reflectance of the peripheral portion lower than a reflectance of the central portion,
wherein an external shape of the emission region corresponds to an internal shape of the electrode, and
wherein the first dielectric film provided in the peripheral portion of the emission region has shape anisotropy in two orthogonal directions.

21. The surface-emitting laser element as claimed in claim 20,
wherein when viewing from a laser oscillation direction, an outer shape of a portion where the electrode provided around the emission region of the lightemitting surface is in contact with a contact layer includes corners.

* * * * *